United States Patent [19]

Satou et al.

[11] Patent Number: 4,835,114
[45] Date of Patent: May 30, 1989

[54] METHOD FOR LPCVD OF SEMICONDUCTORS USING OIL FREE VACUUM PUMPS

[75] Inventors: Akihiko Satou, Maebashi; Tadao Kusaka, Takasaki; Shigeo Tomiyama, Fujioka; Kouzi Aoki, Maebashi; Ichiro Gyobu, Ibaragi; Kimio Muramatsu; Hiroaki Sakamoto, both of Takasaki; Shinjiroo Ueda, Abiko; Masahiro Mase, Tochigi; Takashi Nagaoka, Ibaragi, all of Japan

[73] Assignees: Hitachi, Ltd.; Hitachi Tokyo Electronics Co., Ltd., both of Tokyo, Japan

[21] Appl. No.: 16,567

[22] Filed: Feb. 19, 1987

[30] Foreign Application Priority Data

Feb. 19, 1986 [JP] Japan .................................. 61-32969
Feb. 19, 1986 [JP] Japan .................................. 61-32970
Feb. 19, 1986 [JP] Japan .................................. 61-32971
Apr. 23, 1986 [JP] Japan .................................. 61-92197
Sep. 26, 1986 [JP] Japan .................................. 61-226023

[51] Int. Cl.$^4$ .......................... B05D 3/06; H01C 7/36
[52] U.S. Cl. ............................. 437/81; 148/DIG. 22; 148/DIG. 130; 148/DIG. 169; 156/610; 156/612; 437/85; 437/105; 437/228; 437/949
[58] Field of Search ............... 118/50, 50.1, 715, 720, 118/724, 733; 204/298, 192.1, 192.11, 192.12, 192.32; 427/39, 38, 50, 294, 248.1, 255.1; 156/610–615; 437/105, 180, 195, 228, 81, 85, 949; 148/DIG. 22, 130, 169

[56] References Cited

U.S. PATENT DOCUMENTS

| | | | |
|---|---|---|---|
| 3,907,616 | 9/1975 | Wiemer | 204/192.1 |
| 4,051,010 | 9/1977 | Roth et al. | 204/298 |
| 4,062,319 | 12/1977 | Roth et al. | 118/50.1 |
| 4,063,974 | 12/1977 | Fraas | 156/611 |
| 4,181,544 | 1/1980 | Cho | 156/614 |
| 4,239,955 | 12/1980 | Cho | 437/105 |
| 4,460,673 | 7/1984 | Sukigara et al. | 427/39 |
| 4,596,645 | 6/1986 | Sfirn | 427/38 |
| 4,608,271 | 8/1986 | Hieber et al. | 427/38 |
| 4,668,530 | 5/1987 | Reif et al. | 427/255.1 |

OTHER PUBLICATIONS

Sze, *VLSI Technology*, McGraw-Hill Book Co., New York, NY, 1983, pp. 347–351, 99–101, 312–323.

Primary Examiner—Brian E. Hearn
Assistant Examiner—William Bunch
Attorney, Agent, or Firm—Antonelli, Terry & Wands

[57] ABSTRACT

This invention concerns a production method and a processing apparatus for semiconductor devices, as well as an evacuating apparatus used for the processing apparatus. According to this invention, since the evacuation system of pressure-reduction processing apparatus for conducting various wafer processings during production steps of semi-conductor devices is constituted only with oil-free vacuum pump, deleterious oil contaminations or carbonation products of oils produced from oils upon heating are not present in the pressure-reducing processing chamber as compared with conventional pressure-reducing processing apparatus using a vacuum oil pump as an evacuation pump and the production method of semiconductor devices using such apparatus. Accordingly, highly clean evacuated condition can be attained and, in addition, semiconductor devices at high reliability and with no degradation in the electric characteristics can be obtained by using the pressure-reducing processing apparatus having such a highly clean processing chamber.

16 Claims, 15 Drawing Sheets

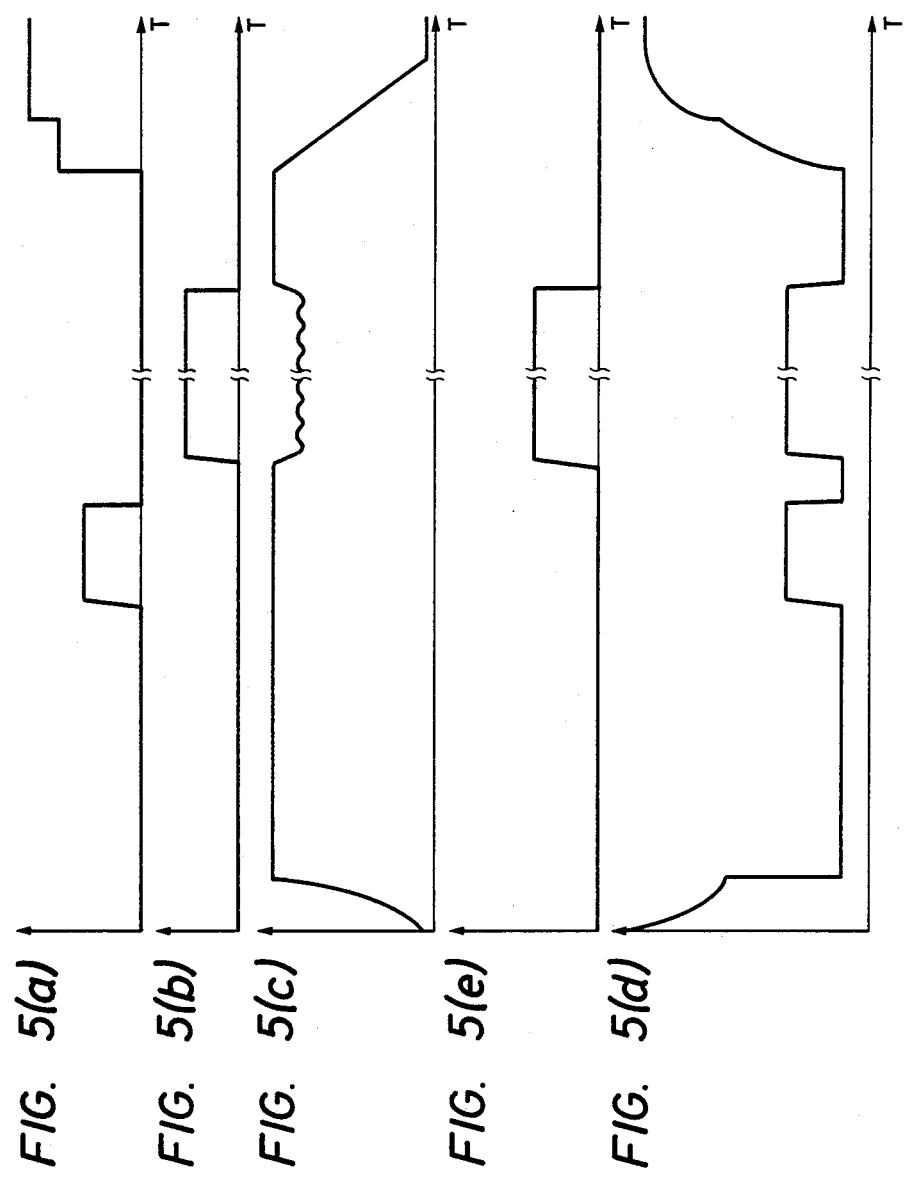

METHOD FOR LPCVD OF SEMICONDUCTORS USING OIL FREE VACUUM PUMPS

BACKGROUND OF THE INVENTION

This invention concerns a method of producing and an apparatus for processing semiconductor devices, as well as an evacuating apparatus for use in the processing apparatus. More specifically, this invention concerns a technic for forming a high vacuum by using an oil-free vacuum pump, which is effective, for example, when utilized upon applying various kinds of processings to wafers in a vacuum atmosphere in the production of semiconductor devices.

There has been known a vacuum CVD apparatus for depositing polysilicon on wafers in the production of semiconductor devices, in which a process tube containing wafers are evacuated to a high vacuum degree by using a rotational oil pump and then monosilane ($SiH_4$) gas is supplied in a great amount at high temperature.

The vacuum CVD technic is described, for example, in "Electronic Material, November 1985, special edition: p58–p59" published from Kakushiki Kaisha Kogyo Chosakai, November 20, 1985

SUMMARY OF THE INVENTION

However, it has been found by the present inventors that since the rotational oil pump is used as an evacuating pump for reducing the pressure inside the process tube which acts as a processing chamber in a vacuum CVD apparatus, back diffusion of oil vapors occurs from the suction side of the rotational oil pump to the process tube, which results in a problem so-called disturb failure in that leak current flows in the insulation membranes due to the reduction in the voltage withstand of the interlayer insulation membranes as the pattern becomes finer.

While on the other hand, there have been known several types of oil-free vacuum pumps not using oils as the high vacuum pump, for example, as disclosed by the present applicant (Hitachi Ltd) in the specification of Japanese Patent Applications Nos Sho 60-88624 and Sho 59-189599, as well as in Japanese Patent laying-open No. Sho 60-216089. Then, we consider to prevent the occurence of the back diffusion of oil vapors by the use of these oil-free vacuum pumps.

Further it has been found by the present inventors that there are problems in the oil-free vacuum pumps for conducting high evacuation in an intermediate flow region or molecular flow region that sufficient evacuation is difficult for those gases comprising molecules of low molecular weight such as hydrogen or helium.

An object of this invention is to provide a novel method of producing semiconductor devices in such a state where deleterious contaminations or deleterious additives that degrade electric properties are eliminated during production steps.

Another object of this invention is to provide a novel processing apparatus capable of producing semiconductor devices in an oil-free and highly clean state.

A further object of this invention is to provide a novel evacuating apparatus for use in various pressure-reducing apparatus capable of pressure control over the range from a normal pressure to a predetermined reduced pressure while maintaining oil-free conditions.

A still further object of this invention is to provide an evacuating technic capable of discharging even those gases comprising molecules of low molecular weight.

These and other objects, as well as novel features of this invention will become apparent the following description of the present invention while referring to the accompanying drawings.

BRIEF DESCRIPTION OF THE DRAWINGS

FIGS. 5 through 7 are diagrams for explanating the effect of this invention;

DESCRIPTION OF THE PREFERRED EMBODIMENT

(Example 1)

Figure 1:
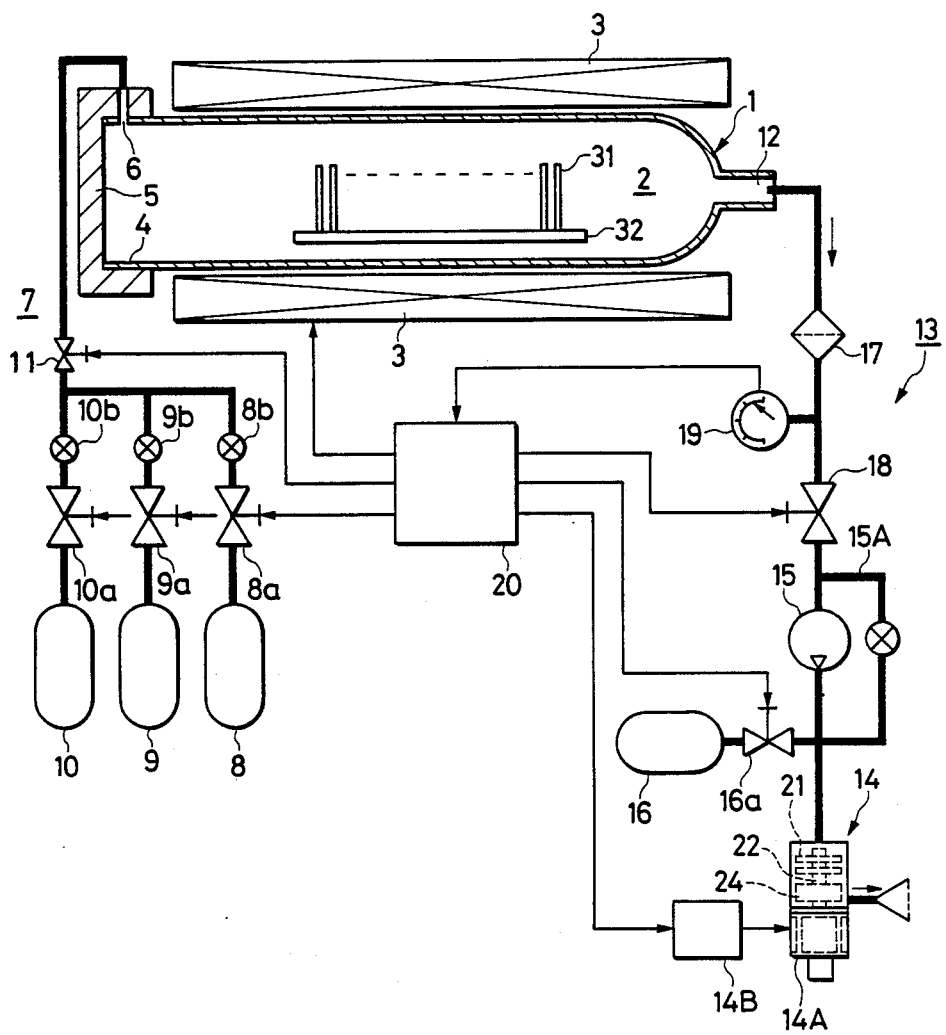
FIG. 1 is a schematic view illustrating a vacuum CVD apparatus using an evacuating apparatus as one emodiment according to this invention.
Figure 2:
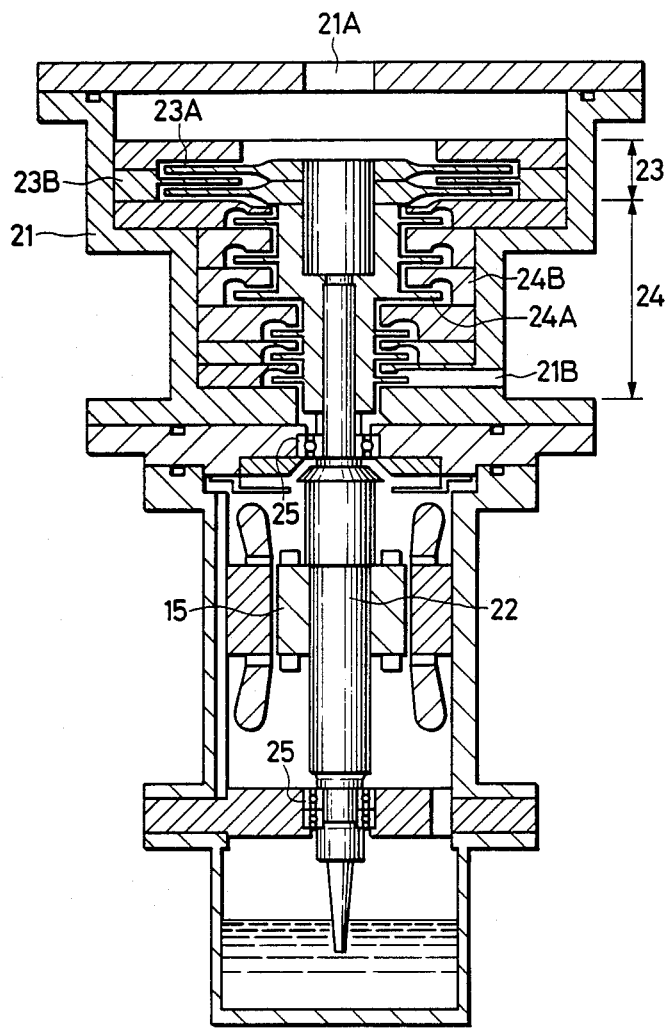
FIG. 2 is a vertical cross sectional view illustrating the entire structure of an oil-free vacuum pump used in the CVD apparatus.
Figure 3A:
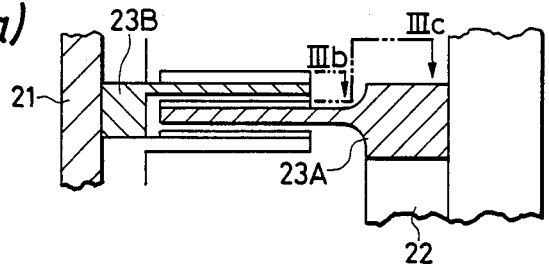
FIG. 3(a) is a vertical cross sectional view illustrating the details of a centrifugal compression pump stage in FIG. 2.
Figure 3B:
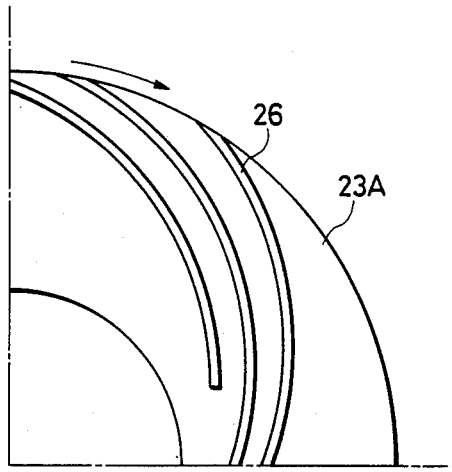
FIGS. 3(b) and (c) are, respectively, views taken along lines IIIb and IIIC in FIG. 3(a)
Figure 4A:
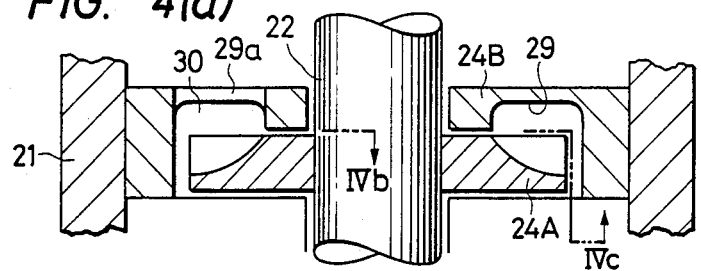
FIG. 4(a) is a vertical cross sectional view illustrating the details of a circumferential flow compression pump stage in FIG. 2.
Figure 4B:
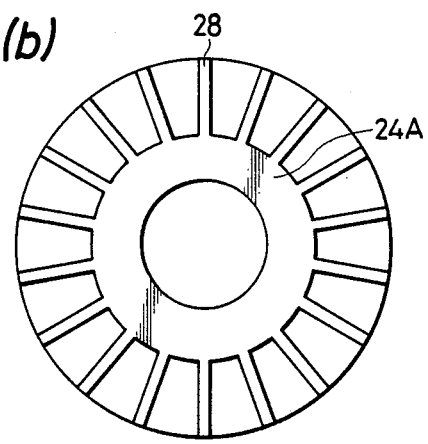
FIGS. 4(b) and (c) are, respectively, views taken along lines IVb and IVc in FIG. 4(a)
Figure 6:
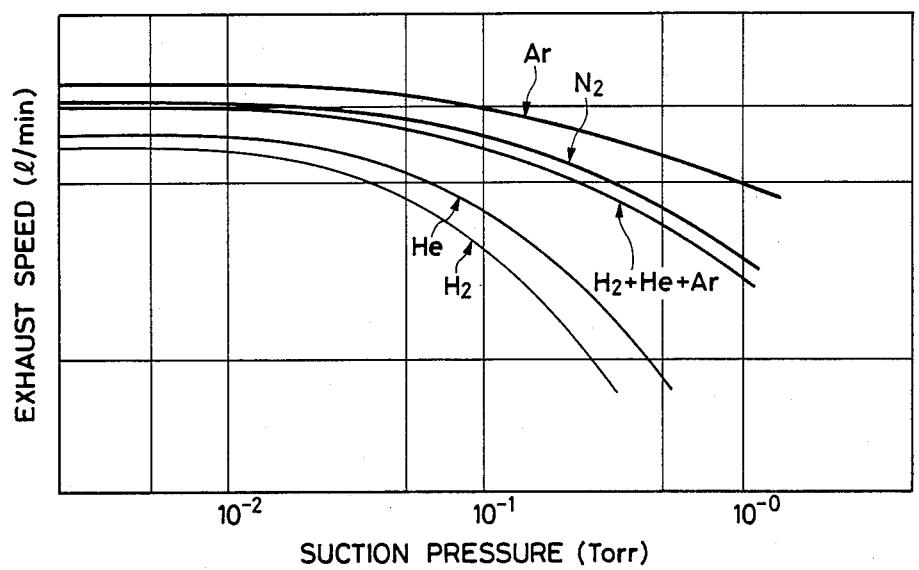

FIG. 1 is a schematic view illustrating a vacuum CVD apparatus using an evacuating apparatus as one embodiment according to this invention, FIG. 2 is a vertical cross sectional view illustrating the entire structure of the oil-free vacuum pump used therein, FIG. 3(a) is a vertical cross sectional view illustrating the details for the centrifugal compression pump stage shown in FIG. 2, FIGS. 3(b) and (c) are, respectively, views taken along lines IIIb and IIIc in FIG. 3(a), FIG. 4(a) is a vertical cross sectional view illustrating the details of the circumferential flow compression pump stage in FIG. 2, FIGS. 4(b) and (a) are, respectively, views taken along lines IVb and IVc in FIG. 4(a), and FIGS. 5 and 6 are, respectively, diagrams for explanating the effect thereof.

In this embodiment, an oil-free vacuum pump is disposed to a pressure-reducing processing apparatus and a supply source for gases comprising molecules of higher molecular weight than hydrogen($H_2$) or helium (He) is connected to the suction side of the oil-free vacuum pump.

According to the above-mentioned means, if the evacuation for the gas of lower molecular weight such as hydrogen($H_2$) or helium (He) becomes insufficient, gases comprising molecules of higher molecular weight can be supplied to the suction side of the oil-free vacuum pump. When the gases comprising the molecules of higher molecular weight are supplied to the suction side, since the evacuating performance such as discharging speed of the oil-free vacuum pump is enhanced, it can atatin a state where gases even of lower molecular weight can be evacuated sufficiently. Accordingly, it is possible to obtain such an evacuating apparatus capable of realizing vacuum states required for various kinds of processings respectively and attain the development of a processing chamber requiring clean vacuum state rapidly and exactly.

In this embodiment, a vacuum CVD apparatus comprises process tube 1 made of quartz glass and substantially formed into a cylindrical configuration and processing chamber 2 is substantially formed to the inside of the process tube 1. To the outside of the process tube 1, is disposed heater 3, which is so constituted as to heat the processing chamber 2 under the control of a controller.

Furnace inlet 4 is opened at one end of the process tube 1 and cap 5 is attached to the furnace inlet 4 such that the latter can be opened and closed. Gas supply port 6 is opened to the cap 5 and gas supply device 7 is connected to the port 6. The gas supply device 7 comprises processing gas source 8, nitrogen gas source 9 as an inert gas, other gas source 10, air valves 8a, 9a and 10a for controlling the amount of these gases supplied respectively and valves 8b, 9b and 10b for opening and closing each of the supply systems.

Discharge port 12 is opened to the other end of process tube 1, and evacuating apparatus 13 according to this invention is connected to the discharge port 12. The evacuating apparatus 13 comprises oil-free vacuum pump 14 detailed later, motor 14A as means for rotationally driving the pump 14, inverter 14B for controlling the number of rotation of the motor 14A, turbomolecular pump 15 connected to the suction side of the oil-free vacuum pump 14, argon gas supply source 16 for supplying argon (Ar) gas as a gas comprising molecules of higher molecular weight than hydrogen ($H_2$) or helium (He) to the suction side of the oil-free vacuum pump 14, valve 16a for controlling the supply from the supply source 16, trap 17 for preventing obstacles from intruding into the pump 14 and air valve 18 for opening or closing the entire evacuating system. Vacuum gage 19 is connected to the evacuating apparatus 13 as means for measuring the pressure inside the processing chamber 2.

The vacuum CVD apparatus has controller 20 comprising a computer and the like. The controller 20 is so constituted that the functions as described later can be attained by controlling the inverter 14B, the valve 16a for the argon gas supply source, the heater 3 and the like based on a predetermined sequence and the measured data from the vacuum gage 19, etc.

The oil-free vacuum pump 14 is constituted as shown in FIGS. 2 through 4. Specifically, the vacuum pump comprises housing 21 having suction port 21A and discharge port 21B, rotational shaft 22 rotatably supported by way of bearing 25 in the housing 21, and centrifugal compression pump stage 23 and circumferential flow compression pump stage 24 to the inside of the housing 21 from the side of the suction port 21A to the side of the discharge port 21B. The rotational shaft 22 is driven by the motor 15 connected therewith, and the number of rotation of the motor 15 is controlled by the inverter 14B.

The centrifugal compression pump stage 23 comprises open vanes 23A and fixed disks 23B disposed alternately in parallel with each other, in which the open vane 23A is attached to the rotational shaft 22 and disposed with a plurality of protruded blades 26 directed inwardly relative to the rotating direction at the surface thereof as shown in FIGS. 3(a) and (b), while the fixed disk 23B is secured to the inner wall of the housing 21 and disposed with a plurality of blades 27 directed inwardly relative to the rotating direction at the surface opposing to the rear face of the vane 23A (the surface not formed with the vane 26) as shown in FIG. 3 (a) and (c).

The circumferential flow compression pump stage 24 comprises vanes 24A and fixed disks 24B disposed alternately in parallel with each other, in which the vane 24A is attached to the rotational shaft 22 and formed with a plurality of blades 23 radially at the outer circumferential surface as shown in FIGS. 4 (a) and (b), while the fixed disk 24B is attached to the inner wall of the housing 21 and formed with U-shaped grooves 29 at the surface opposing to the surface of the vane 24A (the surface disposed with the blade 28) as shown in FIGS. 3 (a) and (c), as well as perforated with aperture 29a at the final end of the groove 29 to form flow channel 30 as illustrated in FIG. 4(a) and (c). The structure and the function of the oil-free vacuum pump are specifically described in the specification of Japanese Patent Application No. Sho 6088624, as well as in corresponding U.S. patent application Ser. No. 855,432.

Explanation will be made to the operation of the oil-free vacuum pump having the constitution as described above.

At the transient state of the initial pump operation, since the entire inside of the pump is at a high pressure nearly to the atmospheric pressure and the flow of the gas forms a viscous stream, the centrifugal compression pump stage 23 acts as a centrifugal compressor. That is, the vane 23A of the centrifugal compression pump stage acts as a compressor vane, in which the flow channel formed being put between the blades 26 of the vane 23A and the fixed disk 23B operates as a return channel for guiding the stream from the outer to the inner radial sides. Further, since the vane 23A conducts compressing effect, the centrifugal compression pump stage 23 performs the effect of flowing a large flow rate as the compressor rather than the pressure loss portion.

In a stationary state where the compression ratio of the circumferential flow compression pump stage 24 is increased and the pressure at the inlet of the circumferential compression pump stage is sufficiently lowered, that is, in the stationary state where the pressure goes below several Torr, the flow of the gas near the inlet of the centrifugal compression pump stage 23, that is, near the suction port 21A of the vacuum pump forms an intermediate flow or molecular flow, by which the centrifugal compression pump stage 23 acts as a Siegbahn molecular pump, that is, the vane 23A having the blade 26 acts as a rotating disk fabricated with a spiral groove and operates as a Siegbahn molecular pump that conducts compressing effect from the inner to the outer radial sides in combination with the rear face of the fixed disk 23B (surface not formed with the blade 27). Further, the fixed disk 23B formed with a plurality of blades 27 acts as a fixed disk fabricated with the spiral groove and operates as the Siegbahn molecular pump that effects compressing effect from the outer to the inner radial sides in combination with the rear face of the vane 23A (surface not formed with the vane 26).

Similarly in the stationary state, since the gas flowing into the circumferential flow compression pump stage 24 has been sufficiently compressed in the centrifugal compression pump 23, the volume flow rate is almost nearly to 0. That is, while the circumferential flow compression pump stage 24 is operated at a stage nearly to the closed state, since the circumferential flow compression pump has a characteristic capable of obtaining a high compression ratio in the closed state, sufficiently low aimed pressure can be reached with less number of steps.

The number of stages and the number of pump rotation for the centrifugal compression pump stage 23 and the circumferential flow compression pump stage 24 are set such that the pressure at the boundary between both of the stages is at the switching point between the viscous flow and the intermediate flow, that is, at several Torr. Usually, the pressure at the suction port 21A of the pump reaches $10^{-3} - 10^{-4}$ Torr capable of realizing the CVD processing as described later by combining from 1 to 3 steps of the centrifugal compression pump stage and from 6 to 10 steps of circumferential flow compression pump stage.

As apparent from the foregoings, since the centrifugal compression pump stage disposed on the sucking port side conducts dual operation in that it acts in the centrifugal compressor at the transient state, while acts as the Siegbahn molecular pump in the stationary state in this vacuum pump, the pressure at the discharge port can be kept near the atmosphereic pressure and high evacuating velocity can be obtained in the initial transient state of the pump operation.

In this embodiment, the oil-free vacuum pump 14 having the above-mentioned constitution is connected hydrodynamically as an auxiliary pump for the turbomolecular pump 15 to the discharge side of the turbomolecular pump, so as to serve for effectively utilizing ghe evacuating operation of the turbomolecular pump 15 in the molecular flow region. Bypass circuit 15A with an ON-OFF valve is connected in parallel with the turbomolecular pump 15. Since the structure and the function of the turbomolecular pump 15 in this embodiment are generally known, detailed description therefor is omitted.

Then, description will be made to one embodiment for the processing method in the case of using the vacuum CVD apparatus of the foregoing constitution while referring to FIGS. 5(a) through (e).

FIGS. 5(a) through 5(e) are sequence flow charts illustrating the process of forming a polysilicon film as one embodiment of the processing method in the vacuum CVD apparatus having the foregoing constitution. Diagrams are shown respectively for the supply of nitrogen gas in FIG. 5(a), supply of monosilane in FIG. 5(b), number of rotation of the oil-free vacuum pump in FIG. 5(c), change of the pressure in the processing chamber in FIG. 5(d), and supply of argon gas in FIG. 5(e). In FIGS. 5(a) through 5(e), each abscissa shows the process elapse time T.

Wafers 31 as objects to be processed for forming polysilicon into films are contained by a plurality from the furnace inlet to the inside of the processing chamber 2 of the process tube 1 in a state where they are stood vertically and arranged on boat 32. When the wafers 31 are contained and the furnace inlet 4 is closed by the cap 5, the main valve 11 of the gas supply device 7 is closed, while the valve 18 for the evacuating apparatus 13 is fully opened by the controller 20, by which the inside of the processing chamber 2 is rapidly evacuated as shown in FIG. 5(d). At the same time, the wafers 31 in the processing chamber 2 are heated to a predetermined temperature by the heater 3.

In this case, as shown in FIG. 5(d), while the pressure in the processing chamber 2 is at an atmospheric pressure, since the centrifugal compression stage 23 of the oil-free vacuum pump 14 acts in the viscous flow region at the initial transient state of evacuation as has been described above, it can directly evacuate the processing chamber without requiring auxiliary pump effective in the viscous flow region such as a mechanical booster pump or rotary pump. In this case since the bypass circuit 15A is opened, the oil-free vacuum pump 14 acts while going around the turbomolecular pump 15.

Then, when a predetermined valve set to the controller 20, that is, a pressure value at which the viscous flow is switched to an intermediate flow or molecular flow region and the centrifugal compression pump stage 23 in the oil-free vacuum pump 14 acts as the Siegbahn molecular pump (several Torr) is measured by the vacuum gage 19, the controller 20 controls the number of rotation of the motor 14A to a constant level by way of the inverter 14B to transfer and maintain the vacuum pump 14 to the stationary state. At the same time, the bypass circuit 15A is closed by the valve and the turbomolecular pump 15 executes the evacuation in the molecular flow region as shown in FIG. 5(c). By the control, the pressure inside the processing chamber 2 is maintained at a predetermined pressure of about $3 \times 10^{-3}$ Torr as shown in FIG. 5(d).

After a predetermined leak check has been conducted, the nitrogen gas valve 9b for the nitrogen gas source of the supply device 7 is closed by the controller 20, and the valve 9a is opened to an appropriate degree and a predetermined amount of the nitrogen gas is supplied to the processing chamber 2 as shown in FIG. 5(a). The nitrogen gas supplied to the processing chamber 2 is evacuated together with the contaminating substances in the processing chamber 2 by the evacuating apparatus 13. Accordingly, the pressure inside the processing chamber 2 has once been increased at a predetemined pressure and, thereafter, maintained constant as shown in FIG. 5(d). The predetermined set pressure is set to a level lower than the pressure required for the oil-free pump 14 and the turbomolecular pump 15 that they act as the Siegbahn molecular pump (several Torr).

When a predetermined period of time previously set to the controller 20 has been elapsed, the nitrogen gas valve 9b of the supply device 7 is closed by the controller 20. Then, when the nitrogen gas in the processing chamber 2 is thereby completely evacuated as shown in FIG. 5(d), the processing gas valve 8b for the processing gas source 8 is opened and the valve 8a is opened to an appropriate degree, in which monosilane gas as the processing gas for the deposition of polysilicon films is supplied by a predetermined amount for a predetermined of time. CVD reaction is taken place with the monosilane gas and by the heating from the heater 3, by which polysilicon is processed into films on the wafers 31.

During film forming processing due to the CVD reaction, while the oil-free vacuum pump 14 maintains evacuation, since it is put to feed-back control by the controller 20 as shown in FIG. 5(c), the evacuated state of the processing chamber 2 is maintained at a predetermined pressure for optimally conducting the processing (for example at 0.3 Torr) as shown in FIG. 5(d). In this case, argon gas is supplied to the suction side of the oil-free vacuum pump 14 by the opening of the argon gas valve 16a as shown in FIG. 5(e) corresponding to the supply of the monosilane gas. The reason for the gas supply will be described later.

When a predetermined film forming processing has been completed, the valve 8b for the processing gas source 8 is closed and the supply of the monosilane gas and the argon gas is interrupted as shown in FIG. 5(c), at the same time, the performance of the oil-free vacuum pump 14 and the turbomolecular pump 15 is increased to the original evacuating capacity as shown in FIG. 5(c). Then, after evacuation is conducted as shown in FIG. 5(d).

When the predetermined after evacuation time has been elapsed, the valves 9a and 9b for the nitrogen gas source 9 are opened by the controller 20 and the nitrogen gas is supplied by a predetermined of amount as shown in FIG. 5(a).

Simultaneously, the valve 18 in the evacuating device 13 is closed and the number of rotation of the oilfree vacuum pump 14 is gradually decreased by the controller 20 as shown in FIG. 5(c), in the course of which the operation is switched from the evacuating effect in the intermediate flow or molecular flow region into the evacuating effect in the viscous flow region and, further, the turbomolecular pump 15 is switched to the bypass circuit 15A. Successively, the pump is maintained at a initial rotation speed and then set to stand-by for the next processing.

Then, the cap 5 is detached and the wafers 31 are taken out from the furnace inlet 4 to complete a predetermined CVD processing.

By the way, since the boiling point of the monosilane gas used for depositing polysilicon is higher than the temperature of the liquid nitrogen, a cold trap using liquid nitrogen can not be adopted to the evacuating apparatus for the vacuum CVD apparatus, because the evacuating system is rapidly clogged due to the trapping of the monosilane gas in the cold trap.

In the case where an oil rotational pump is used as the vacuum pump and if no cold trap is disposed to the evacuating apparatus, when the processing chamber is evacuated before and after the film forming processing due to the CVD reaction, oil vapors are back-diffused to the processing chamber. As a result, the inside of the processing chamber is contaminated with the oil vapors to cause various secondary troubles. As secondary troubles, there can be mentioned unsatisfactory characteristics of products due to the deposition of the oil vapors to the wafers, corrosion of the process tube or degradation of pump oils that cause reduction in the vapor pressure due to the corrosive liquid formed upon contact of processing gases and oil vapors.

Further, wafer processing is generally conducted in the pressure-reduced processing device or the like at a state heated to a temperature higher than 400° C. That is, wafers are processed in a heated state under high temperature (at least higher than 400° C.) in the apparatus used for producing semiconductor devices, specifically, CVD apparatus, sputtering apparatus, dry-etching apparatus, thermally oxidizing apparatus and heat diffusion apparatus. In this case, if an oil vacuum pump is used as the evacuation pump, oil vapors back-refused to the inside of the processing chamber are burnt in the processing chamber under the heated state to form carbonization products of the oils. Since the carbonization products of the oils have electroconductivity and are large in the grain size, they give various undesired effects upon producing semiconductor devices. Specifically, the carbonation products of oils are incorporated in the CVD films during CVD film formation, or the carbonation products of oils intrude into the semiconductor substrate during wafer processing. Accordingly, if the carbonation products of oils are present, they cause troubles leading to the reduction of various electric properties such as reduction in the electrical insulating performance of the insulation films or reduction in the memory circuit characteristics of the semiconductor memory.

In this embodiment, however, since the processing chamber 2 is directly evacuated by the oil-free vacuum pump 14 and the turbomolecular pump 15 using no suction medium at all as has been described above, the phenomenon that the oil vapors are back-diffused to the processing chamber 2 does not occur naturally and secondary troubles caused thereby can also be avoided.

By the way, the present inventor has found a problem that the pressure inside the processing chamber 2 is gradually increased by merely operating the oil-free vacuum pump 14 and the turbomolecular pump 15 when the monosilane gas is supplied to the processing chamber during operation since a great amount of helium (He) added to the monosilane gas as the carrier gas in view of the safety and increase in the amount of hydrogen gas resulted upon decomposition of monosilane gas due to reaction ($SiH_4 = Si + 2H_2$). This is considered that the evacuating velocity of the turbo-molecular pump and the oil-free vacuum pump to those molecules of low molecular weight (mass) such as hydrogen ($H_2$) or helium (He) is liable to be reduced in view of the evacuating principle thereof.

However, it has been found by the present inventors that when an argon gas is supplied to the suction side of the oil-free vacuum pump 14 having such a constitution as described above (position for the supply has no substantial effect so long as the gas is supplied from the suction side) during supply of the monosilane gas as shown in FIG. 3(e), the pressure inside the processing chamber 2 can be maintained to a predetermined pressure (0.3 Torr) as described above by the oil-free vacuum pump 14 and the turbomolecular pump 15. It is considered that while the compression ratio of helium or hydrogen gas of lower molecular weight in the molecular pump is low and the evacuating velocity is liable to be reduced, the evacuating velocity is increased for the helium or hydrogen gas of low molecular weight by mixing argon gas of high molecular weight to the suction side of the oil-free vacuum pump 14 thereby increasing the compression ratio.

FIG. 6 is a diagram illustrating the performance of the oil-free vacuum pump as the result of the experiment conducted by the present inventors. It can be seen from the diagram that the evacuating performance for the gas of lower molecular weight such as hydrogen ($H_2$) and helium (He) are small. Further, it can be seen also that the evacuating performance for the gas of higher molecular weight such as argon (Ar) or nitrogen ($N_2$) is great. Further, it can be seen that the evacuating performance can be enhanced when hydrogen or helium is evacuated while adding a high molecular weight gas such as argon.

Further, since the flow rate of the argon gas supplied is dependent on the flow rate of the reaction gas and the pressure inside the processing chamber, it is desired that the optimum flow rate to be supplied is determined corresponding to individual conditions. Furthermore, although the supply source for the argon gas is attached to the suction side of the pump, it is to be noted that it may be also disposed near the suction port of the pump.

Figure 7:
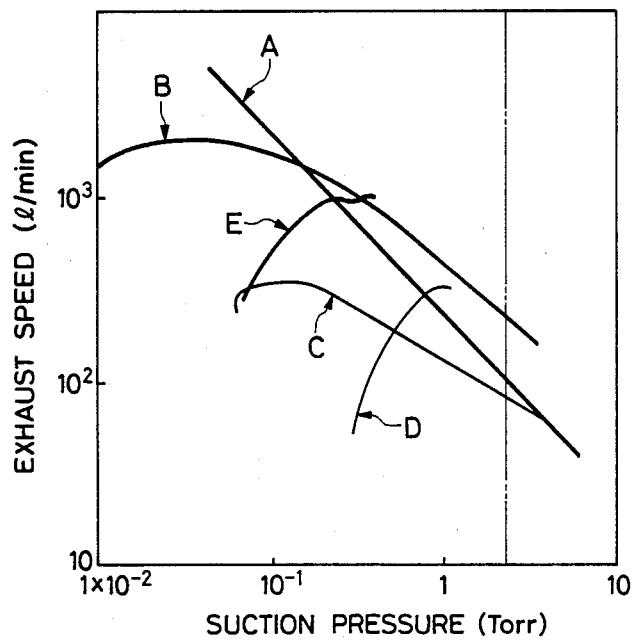

FIG. 7 is a block diagram illustrating the performance of the oil-free vacuum pump 14 having the foregoing constitution, in which the ordinate represents the evacuating speed (lr/min) and the abscissa represents suction pressure (Torr) respectively. In the diagram, the linear line A represents the amount of reaction gas supplied (comprising 48% monosilane gas and 52% helium gas) (300 cc in average/min), the curve B represents the evacuating characteristic to helium by the oil-free vacuum pump alone, the curve C represents the effective evacuating characteristics to the reaction gas in the evacuating apparatus 13, the curve D represents the evacuating characteristics when the argon gas supplied to the suction side of the oil-free vacuum pump and the curve E represents the evacuating characteristics when the nitrogen gas is supplied to the suction side of the oil-free vacuum pump respectively.

It can be seen from the diagram that since the evacuating speed is rapidly increased to higher than the effective evacuating characteristics represented by the curve C when the argon gas is supplied as shown by the curve D, the inside of the processing chamber can be maintained to a predetermined pressure by evacuating helium or nitrogen gas.

According to the embodiment as described above, the following advantageous effects can be obtained.

(1) If the evacuation for those gases of low molecular weight such as hydrogen ($H_2$) or helium (He) becomes insufficient by the oil-free vacuum pump, a gas of higher molecular weight than helium (He) is supplied to the suction side of the oil-free vacuum pump, thereby enabling the oil-free vacuum pump to perform a sufficient evacuating performance also for the gas with lower molecular weight gas. Therefore, a desired vacuum condition can be prepared by the oil-free vacuum pump even in the processing where a lower molecular weight gas is generated or used.

(2) Since an oil-free vacuum pump capable of realizing a desired vacuum condition for each of the processings can be provided, it is possible to attain the development of a processing chamber requiring clean vacuum state rapidly and exactly.

(3) Since the risk of the back diffusion of suction medium to the processing chamber under high vacuum condition can necessarily be avoided by using the oil-free vacuum pump using no diffusing suction medium as oil or mercury, secondary troubles derived from the back-diffusion can completely be prevented, and the quality and the reliablity of the processing the obtained products can be improved.

Although this invention has been described specifically referring to the embodiment made by the present inventor, this invention is no way restricted to the foregoing embodiment but various modifications are possible within a range not departing from the gist of the invention.

Figure 8:
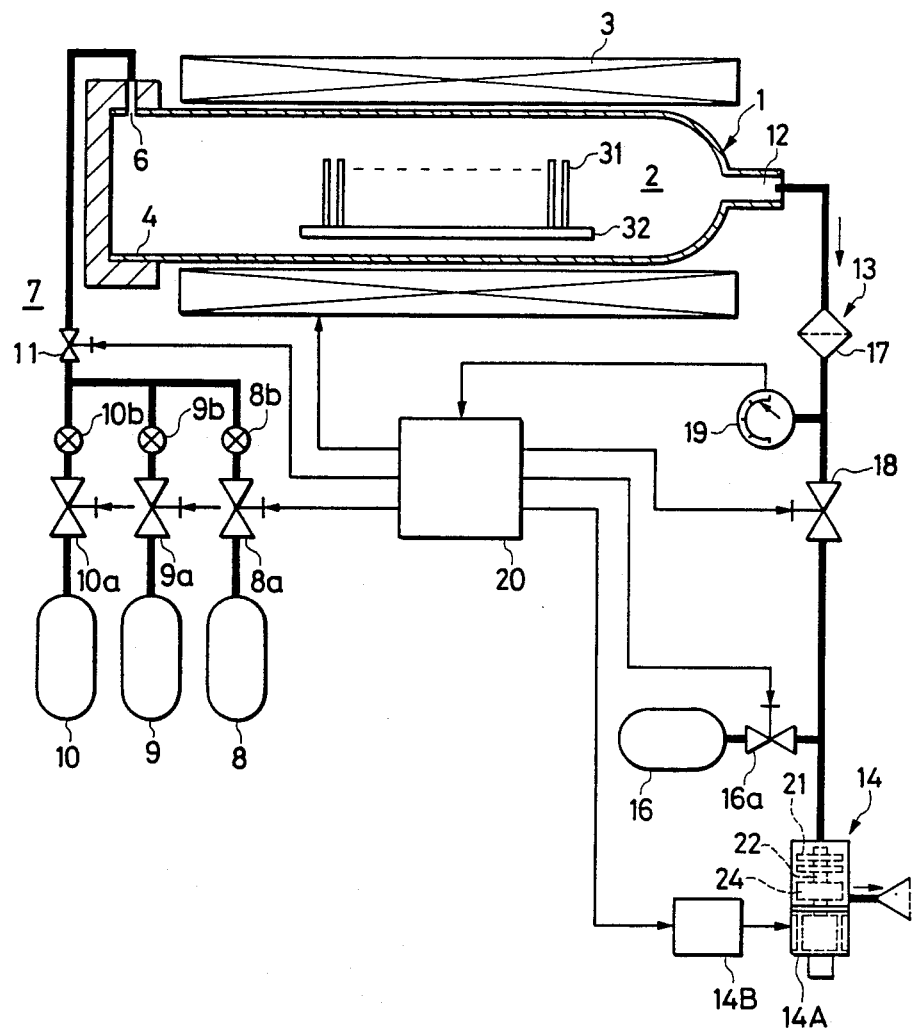
FIG. 8 is a schematic view illustrating another embodiment according to this invention.

For instance, it may be so adapted that the processing chamber 2 is evacuated directly by the oil-free vacuum pump 14 having the foregoing constitution as shown in FIG. 8 not restricted only to the use of the turbomolecular pump.

Further, the high molecular weight gas may be nitrogen gas or the like not being limited only to the argon gas. In this case, undesired effect to the processing can be avoided by the use of the inert gas.

The supply port for a a high molecular weight gas may be disposed at any place so long as it is on the suction side of the oil-free vacuum pump, not being limited only to the vicinity of the sucking port of the oil-free vacuum pump, such as near the processing chamber or at the processing gas supply port, or the gas may be mixed with the processing gas. Further, the supply port of the high molecular weight gas may be disposed to the pump itself as described above.

Furthermore, the vacuum pump is not only retricted to such a constitution as rotationary driven by the motor and the number of rotation may not be restricted only to the inverter control.

Although the foregoing explanations have mainly been made to such a case of applying the invention made by the present inventor to the field of producing semiconductor devices which are the background art thereof, this invention no way restricted only thereto but is also applicable generally to those cases where processing is conducted in a highly evacuated processing chamber.

Advantageous effects typically obtained by the invention disclosed in the present application will now be explained simply below.

By connecting the supply source of a gas with higher molecular weight than helium to the suction side of the oil-free vacuum pump, a high molecular weight gas can be supplied to the suction side of the oil-free vacuum pump when the evacuation for a lower molecular weight gas then helium becomes insufficient by the oil-free vacuum pump. Accordingly, the oil-free vacuum pump can perform a sufficient evacuating performance also for the low molecular weight gas and, as a result, desired vacuum condition can be prepared even for the processing where low molecular weight gas is generated or used, which enables to attain the development of a processing chamber requiring clean vacuum condition rapidly and exactly.

EXAMPLE 2

Figure 3C:
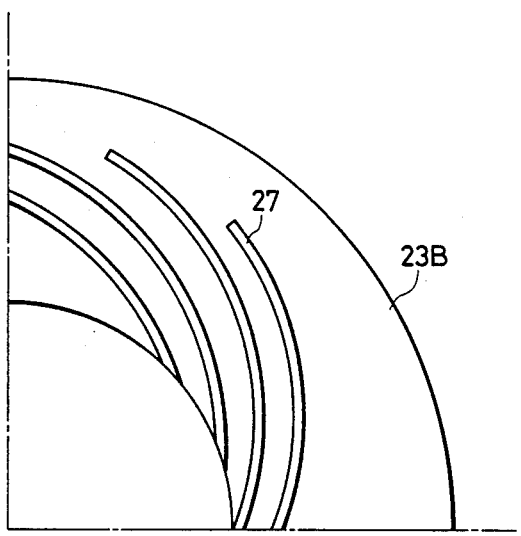
Figure 4C:
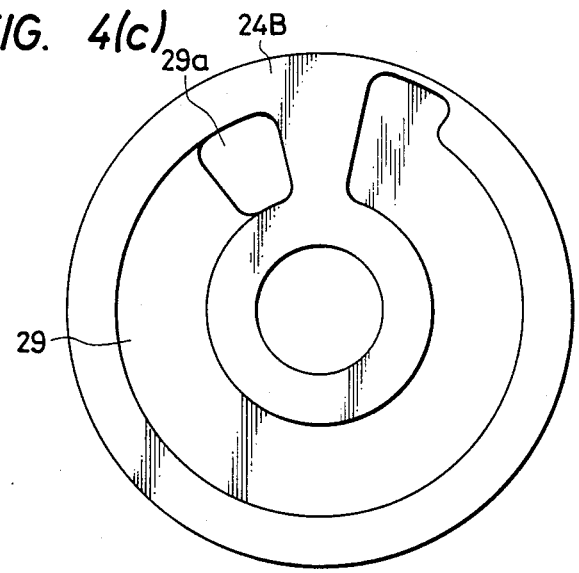

FIG. 8 is a schematically view illustrating a vacuum CVD apparatus using an evacuating apparatus as another embodiment according to this invention, FIG. 2 is a vertical cross sectional view illustrating the entire structure of an oil-free vacuum pump used therefor, FIG. 3(a) is a vertical cross sectional view illustrating the details of the centrifugal compression pump stage shown in FIG. 2, FIG. 3(b) and FIG. 3(c) are views taken along lines IIIb and IIIC shown in FIG. 3(a), FIG. 4(a) is a vertical cross sectional view illustrating the details of the circumferential flow compression pump stage shown in FIG. 2, FIGS. 4(b) and 4(c) are views taken along lines IVb and IVc in FIG. 4(a), and FIG. 5 is a diagram for explanating the operation thereof.

The evacuating apparatus of this embodiment is provided with an oil-free vacuum pump not using suction medium and sealing members acting in a diffused state such as oils or mercury, and it is so adapted that the vacuum condition is controlled by adjusting the number of rotation of the vacuum pump.

Since no suction medium such as oil or mercury is used for the vacuum pump in the evacuating apparatus, it is essentially free from the phenomenon that diffused substances of the suction medium (vapors) cause backflow to the processing chamber in an evacuated state. Accordingly, occurrence of secondary troubles such as contamination for the object to be processed due to the back diffusion of oil vapors can be avoided.

Further, since a desired vacuum condition can be prepared by controlling the number of rotation of the oil-free vacuum pump, the vacuum condition can be maintained and administrated easily and exactly.

In this embodiment, a vacuum CVD apparatus comprises process tube 1 made of quartz glass and substantially formed into a cylindrical configuration and processing chamber 2 is substantially formed to the inside of the process tube 1. To the outside of the process tube 1, is disposed heater 3, which is so constituted as to heat the processing chamber 2 under the control of a controller.

Furnace inlet 4 is opened at one end of the process tube 1 and cap 5 is attached to the furnace inlet 4 such that the inlet can be opened and closed. Gas supply port 6 is opened to the cap 5 and gas supply device 7 is connected to the port 6. The gas supply device 7 comprises processing gas source 8, nitrogen gas source 9 as an inert gas, other gas source 10, air valves 8a, 9a and 10a for controlling the amount of these gases supplied respectively and valves 8b, 9b and 10b for opening and closing each of the supply systems.

Discharge port 12 is opened to the other end of the process tube 1, and evacuating apparatus 13 according to this invention is connected to the discharge port 12. The evacuating apparatus 13 comprises oil-free vacuum pump 14 detailed later, motor 15 as means for rotationally driving the pump 14, inverter 16 for controlling the number of rotation of the motor 15, trap 17 for preventing obstacles from intruding into the pump 14 and air valve 18 for opening and closing the entire evacuating system in a gas discharging pipeway made of a single stainless steel tube. Vacuum gage 19 is connected to the evacuating apparatus 13 as means for measuring the pressure inside of the processing chamber 2.

The vacuum CVD apparatus has controller 20 comprising a computer and the like. The controller 20 is so constituted that the functions as described later can be attained by controlling the inverter 16, the valve 16a for the argon gas supply source, the heater 3 and the like based on a predetermined sequence and the measured data from the vacuum gage 19, etc.

The oil-free vacuum pump 14 is constituted as shown in FIGS. 2 through 4. Specifically, the vacuum pump has the same constitution as detailed in Example 1 above.

Since suction medium such as oil or mercury is not used as in the case of the diffusion pump, clean vacuum condition can be prepared by this vacuum pump. That is, in the diffusion pump, since high vacuum condition is prepared by diffusing oil or mercury and sucking the vapors by an auxiliary pump, back-diffusion phenomenon of vapors occurs under a high vacuum condition. Further, in the rotational oil pump, back-diffusion phenomenon of oil vapors as the sealing material occurs. While on the other hand, since a high vacuum condition can be prepared directly without using such a suction medium or sealing material in the oil-free vacuum pump, it is essentially free from the back-diffusion phenomenon of the medium.

Then, description will be made to the operation of one embodiment for the vacuum CVD apparatus of the foregoing constitution while referring to FIGS. 5(a) through 5(e).

FIGS. 5(a) through 5(e) are sequence flow charts illustrating the process of forming polysilicon films by the vacuum CVD apparatus having the foregoing constitution. Diagrams are shown respectively for the supply of nitrogen gas in FIG. 5(a), supply of monosilane in FIG. 5(b), number of rotation of the oil-free vacuum pump in FIG. 5(c) and change of pressure in the processing chamber in FIG. 5(d).

Wafers 31 as objects to be processed for forming polysilicon into films are contained by a plurality number from the furnace inlet to the inside of the processing chamber 2 of the process tube 1 in a state where they are stood vertically and arranged on boat 32.

When the wafer 31 are contained and the furnace inlet 4 is closed by the cap 5, the nitrogen gas valve 9b of the gas supply device 7 is closed, while the valve 18 for the evacuating apparatus 13 is fully opened by the controller 20, by which the inside of the processing chamber 2 is rapidly evacuated as shown in FIG. 5(d). At the same time, the wafers 31 in the processing chamber 2 are heated to a predetermined temperature by the heater 3.

In this case, as shown in FIG. 5(d), while the pressure in the processing chamber 2 is at an atmospheric pressure, since the centrifugal compression stage 23 of the oil-free vacuum pump 14 acts in the viscous flow region at the initial transient state of evacuation as has been described above, it can directly evacuate the processing chamber 2 without requiring auxiliary pump effective in the viscous flow region such as a mechanical booster pump or rotary pump.

Then, when a predetermined value set to the controller 20, that is, a pressure value at which the viscous flow is switched to an intermediate flow or molecular flow region and the centrifugal compression pump stage 23 in the oil-free vacuum pump 14 acts as the Siegbahn molecular pump (several Torr) is measured by the vacuum gage 19, the controller 20 controls the number of rotation of the motor 15 to a constant level by way of the inverter 16 to transfer and maintain the vacuum pump 14 to the stationary state. By this control, the pressure inside the processing chamber 2 is maintained at a predetermined pressure of about $3 \times 10^{-3}$ Torr as shown in FIG. 5(d).

After a predetermined leak check has been conducted, the nitrogen gas valve 9b for the supply device 7 is opened by the controller 20, and the valve 9a for the nitrogen gas source 9 is opened to an appropriate degree and a predetermined amount of the nitrogen gas is supplied to the processing chamber 2 as shown in FIG. 5(a). The nitrogen gas supplied to the processing chamber 2 is evacuated together with the contaminating substances in the processing chamber 2 by the evacuating apparatus 13. Accordingly, the pressure inside the processing chamber 2 has once been increased at a predetermined pressure and, thereafter, maintained constant as shown in FIGS. 5(d). The predetermined set pressure is set to a level lower than the pressure required for the oil-free pump 14 molecular to act as the Siegbahn molecular pump (several Torr).

By the way, since the contaminating substances discharged being carried on the nitrogen gas are collected by the trap 17, the risk that obstacles flow into the oil-free pump 14 and damage the function thereof can be avoided.

When a predetermined period of time previously set to the controller 20 has been elapsed, the nitrogen gas valve 9b of the supply device 7 is closed by the controller 20. Then, when the nitrogen gas in the processing chamber 2 is thus completely evacuated as shown in FIG. 5(d), the processing gas valve 8b is opened and the valve 8a for the processing gas source 8 is opened to an appropriate degree, in which monosilane gas as the processing gas for the deposition of polysilicon films is supplied by a predetermined amount for a predetermined of time as shown in FIG. 5(b). CVD reaction is taken place with the monosilane gas under the heating from the heater 3, by which polysilicon is processed into films on the wafers 31.

During film forming processing due to the CVD reaction, the oil-free vacuum pump 14 maintains evacuation and, since it is put to feed-back control by the controller 20 as shown in FIG. 5(d), the vacuum condition in the processing chamber 2 is maintained at a predetermined pressure for optimally conducting the processing (for example at 0.3 Torr) as shown in FIG. 5(d).

That is, when the monosilane gas is supplied to the processing chamber 2, the inside pressure is increased and measured by the vacuum gage 19. After the supply of the monosilane gas, when a pressure lower than the aimed value required for the optimal CVD reaction (for example, 0.3 Torr) by the vacuum gage 19, the controller 20 performs speed-reduction control for the number of rotation of the motor 15 by way of the inverter 16 to thereby control the evacuating performance of the vacuum pump 14 within a range capable of maintaining the effect of the Siegbahn molecular pump. Under the correlationship between the reduction of the evacuation performance and the supply of the monosilane gas, the inner pressure in the processing chamber 2 is increased. When a pressure higher than the aimed value as described above is measured by the vacuum gage 19, the controller 20 performs acceleration control for the number of rotation of the motor 15 by way of the inverter 16 thereby enhancing the evacuating performance of the vacuum pump 14. Subsequently, by repeating such feed-back control, the vacuum condition in the processing chamber 2 is maintained at an ideal state under the supply of the monosilane gas and film forming processing is conducted under the optimal CVD reaction.

When a predetermined film forming processing has been completed, the valves 8a and 8b for the processing gas source 8 are closed and the supply of the monosilane gas is interrupted by the controller 20 as shown in FIG. 5(c) and, at the same time, the performance of the oil-free vacuum pump 14 is increased to the original evacuating capacity as shown in FIG. 5(c). Then, after evacuation is conducted as shown in FIG. 5(d).

When a predetermined after evacuation time has been elapsed, the valves 9a and 9b for the nitrogen gas source 9 are opened by the controller 20 and the nitrogen gas is supplied by a predetermined of amount as shown in FIG. 5(a).

Simultaneously, the valve 18 in the evacuating apparatus 13 is closed and the number of rotation of the oil-free vacuum pump 14 is gradually decreased by the controller 20 as shown in FIG. 5(c), in the course of which the operation is switched from the evacuating operation in the intermediate flow or molecular flow region into the evacuating operation in the viscous flow region and, successively, the pump is maintained at the initial rotation speed and set to stand-by for the next processing.

Then, the cap 5 is detached and the wafers 31 are taken out from the furnace inlet 4 to complete a predetermined CVD processing.

By the way, since the boiling point of the monosilane gas used for depositing polysilicon is higher than the temperature of the liquid nitrogen, a cold trap using liquid nitrogen can not be adopted to the evacuating apparatus for the vacuum CVD apparatus, because the evacuating system is rapidly clogged due to the trapping of the monosilane gas in the cold trap.

In the case where a rotational oil pump is used as the vacuum pump and if no cold trap is disposed to the evacuating apparatus, when the processing chamber is evacuated before and after the film forming processing due to the CVD reaction, oil vapors are back-diffused to the processing chamber. As a result, the inside of the processing chamber is contaminated with the oil vapors to cause various secondary troubles. As secondary troubles, there can be mentioned unsatisfactory characteristics of products due to the deposition of the oil vapors to the wafers, corrosion of the process tube or degradation of pump oils that cause reduction in the vapor pressure due to the corrosive liquid formed from the of processing gases upon contact with oil vapors.

In this embodiment, however, since the processing chamber 2 is directly evacuated by the oil-free vacuum pump 14 using no suction medium at all as has been described above, the phenomenon that the oil vapors are backdiffused to the processing chamber 2 can not occur naturally and secondary troubles caused thereby can also be avoided.

According to the embodiment as described above, the following advantageous effects can be obtained.

(1) Since the risk of the back diffusion of diffused substances of suction medium to the processing chamber under a high vacuum condition can necessarily be avoided by the use of the oil-free vacuum pump using no diffusing suction medium as oils or mercury at all, secondary troubles derived from the back-diffusion can completely be prevented, and the quality and the reliability of the processing and the products can be improved.

(2) Since the processing chamber can be maintained at a desired vacuum condition even during the supply of the processing gas by adapting such that the number of rotation of the oil-free vacuum pump is put to feed-back control based on the vacuum condition in the processing chamber, an optimal state can be prepared for the processing thereby enabling to improve the quality and the reliability of the processing and the products.

(3) Since the processing chamber can be evacuated over the range from an atmospheric pressure condition to a high vacuum condition in one system of vacuum pump by constituting the oil-free vacuum pump such that the evacuating action for the viscous flow region (hereinafter referred to as usual evacuating operation) and high evacuating operation in the intermediate flow or molecular flow region (hereinafter referred to as high evacuation operation) can be conducted continuously, it is no more necessary for the combined use of an auxiliary pump for conducting usual evacuating operation such as a mechanical booster pump or rotary pump, or high vacuum pump for conducting high evacuation such as an oil diffusion pump, as well as it is possible to improve the space efficiency and facilitate the multi-stage construction of the processing chamber.

(4) Since either of the usual evacuating operation or high evacuating operation and desired evacuating speed can simply be obtained by the control for the number of rotation by adapting the oil-free vacuum pump such that switching between the usual evacuating operation and high evacuating operation, as well as increase or decrease of the evacuating speed in each of the regions can be controlled by the increase or decrease for the number of rotation, the processing can be conducted properly and the design for the processing sequence or the like can be simplified.

(5) A vacuum pump of a simgple structure capable of attaining from the usual evacuating operation to the high evacuating operation in one system and by the control for the number of rotation can be obtained practically by constituting the oil-free vacuum pump such that the centrifugal compression pump stage is disposed on the suction side and the circumferential flow compression pump stage is disposed on the exhaust side respectively, the rotating part of the centrifugal compression pump stage is constituted with an open type vane having a plurality of sweep back blades, while the fixed part thereof is constituted with a fixed disk having a plurality of blades attached so as to be opposed to the rear face of the vane, in which the direction thereof at the radial outer portion is inwarded relative to the rotational direction.

(6) Since the control can control be conducted simply, accurately and efficiently by adapting the oil-free vacuum pump such that it is rotaionally driven by the motor and the number of rotation of the motor is controlled by the inverter, the processing can be conducted more properly.

Although this invention has been described specifically referring to the embodiment made by the present inventor, this invention is no way restricted to the foregoing embodiment but various modifications are naturally possible within a range not departing from the gist of the invention.

For instance, the oil-free vacuum pump is not restricted only to the combination of the centrifugal compression pump stage and the circumferential flow compression pump stage, but it may also be constituted by the combination of the centrifugal compression pump with a mechanical booster pump, rotary pump, screw pump or scroll pump, combination of scroll pumps with each other, combination of a scroll pump with a mechanical booster pump and the like.

The vacuum pump is not restricted only to such a constitution as rotational drive by the motor, or to such a constitution as controlled for the number or rotation by the inverter.

Although the foregoing explanations have mainly been made to such a case of applying the invention made by the present inventor to the art of producing semiconductor devices, which is the background art thereof, this invention is no way restricted only thereto but is also applicable generally to such cases of conducting processing in a processing chambers undergoing high evacuation.

Explanation will then be made simply to the effects obtained by typical embodiments of the invention disclosed in the present application as below.

Since back-diffusion phenomenon of oils to a highly evacuated processing chamber can be prevented by disposing an oil-free vacuum pump not using suction medium, the quality and the reliability of the processing and the products can be improved.

Further, as apparent from the vacuum CVD apparatus in this embodiment, an oil-free vacuum pump not using suction medium or sealing material acting in a diffused state such as oil or mercury is disposed to the evacuation apparatus for evacuting the processing chamber in the processing apparatus according to this invention and the number of rotation of the vacuum pump is put to feed-back control depending on the vacuum condition in the processing chamber.

Since oil, mercury or like other suction medium is not used for the vacuum pump in the processing apparatus, it is essentially free from the phenomenon that the diffusing substances (vapors) of the suction medium are back-flown to the processing chamber in the highly evacuated state. Accordingly, occurrence of secondary troubles such as contamination to the objects to be processed due to the back diffusion of the oil vapors can be prevented.

Furthermore, since the processing chamber can be maintained at a desired vacuum condition even during the supply of the processing gas by applying feed-back control to the number of rotation for the oil-free vacuum pump depending on the vacuum condition in the processing chamber, optimum processing can be conducted in the processing chamber.

EXAMPLE 30

A method of producing semiconductor devices by using a processing apparatus as one embodiment according to this invention will be described successively below while referring to FIGS. 10(a) through 10(l). In the following descriptions, although the explanations are made to the production step of an integrated circuit (IC) mainly composed of MOS transistors of a metal oxide semiconductor structure as an example for the semiconductor device, it may of course by applicable to the production step of an integrated circuit mainly composed of bipolar transistors.

Figure 10A:
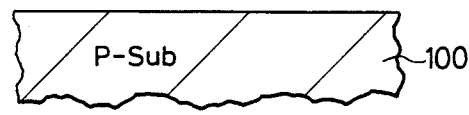
FIGS. 10(a) through (l) are, respectively, cross sectional views illustrating the method of producing semiconductor devices as one embodiment according to this invention.

(a) FIG. 10(a) shows p-type silicon single crystal semiconductor substrate 100. The substrate 100 is formed by dividing silicon single crystal semiconductor formed by a single crystal semiconductor growing apparatus using an oil-free vacuum pump into configuration of wafers and it has an extremely high quality.

Figure 10B:

(b) FIG. 10(b) shows a state in which silicon oxide film insulation film 101 is formed to the main surface of the substrate 100 by applying heat treatment to the substrate. The silicon oxide film 101 is formed by using a heat treatment apparatus having an oil-free vacuuum pump, in which it is formed under clean atmospheres with no oil vapor back-diffusion and has extremely good film quality.

Figure 10C:
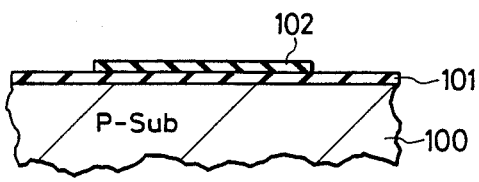

(c) FIG. 10(c) shows the state in which silicon nitride film 102 has an oxidation-resistant mask is formed selectively on the silicon oxide film 101. The silicon nitride film 102 is formed by a plasma CVD apparatus using an oil-free vacuum pump and has an extremely high film quality.

Figure 10D:
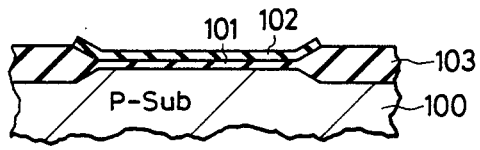

(d) FIG. 10(d) shows the state in which heat treatment is applied by using the silicon nitride film 102 as a heat-resistant mask thereby selectively growing the silicon oxide film 101 on the surface of the substrate 100 to form field oxide film 103. The heat treatment is conducted by the heat treatment apparatus using the oil-free vacuum pump.

Figure 10E:
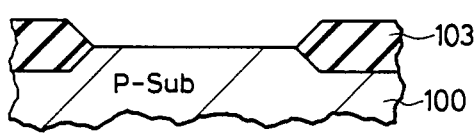
Figure 10F:
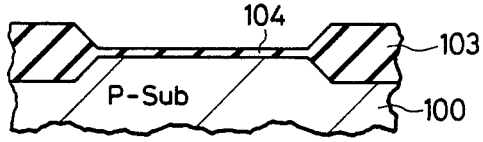

(e) FIG. 10(e) shows the state in which the silicon nitride film 102 and the silicon oxide film 103 are eliminated to expose the surface of the substrate 100. A MOS transistor as described later is formed to the exposed surface of the substrate 100. (f) FIG. 10(f) shows the state in which gate oxide film 104 of a MOS transistor is formed. Since the gate oxide film 104 is an important film for determining the characteristics of the MOS transistor, extremely high film quality if required. In this production step, since the gate oxide film is formed by the heat treatment apparatus using the oil-free vacuum pump, the film quality is high. As a result, electric conduction (short-circuit) between the gate electrode and the substrate 100 can surely be prevented.

Figure 10G:
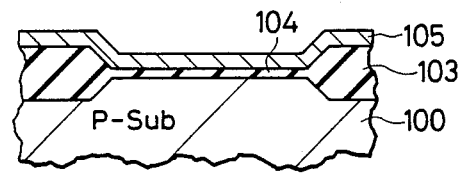

(g) FIG. 10(g) shows a state in which polycrystalline silicon 105 is deposited, for example, as the gate electrode material for the MOS transistor. The polycrystalline silicon 105 is formed by the vacuum CVD apparatus using the oil-free vacuum pump as described above. As a result, the film quality is extremely high.

Figure 10H:
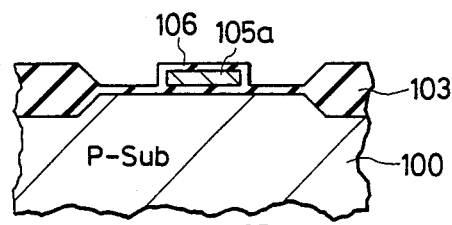

(h) FIG. 10(h) shows a state in which the polycrystalline silicon 105 is subjected to etching by an etching apparatus using the oil-free vacuum pump to form gate electrode 105a and polycrystalline silicon as the gate electrode 105a is further thermally oxidized by the heat treatment apparatus using the oil-free vacuum pump to form silicon oxide film 106.

Figure 10I:
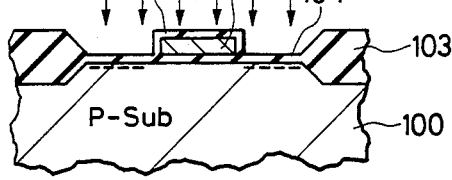

(i) FIG. 10(i) shows a state in which arsenic (As) ions are introduced to the gate electrode 105a and a self line at the surface of the substrate 100 by using the gate electrode 105a as an impurity introduction inhibition mask. The ion spiking apparatus has an oil-free vacuum pump and the inside of the processing chamber is extremely clean, in which impurities are introduced.

Figure 10J:
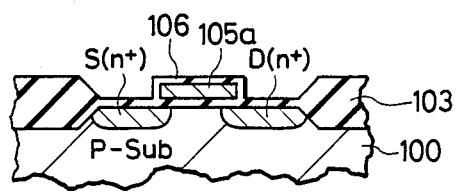
Figure 10K:
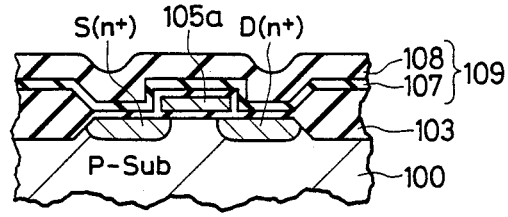

(j) FIG. 10(j) shows a state in which arsenic (As) ions introduced to the surface of the substrate 100 are diffused to the inside of the substrate 100 thereby forming source (S) and drain (D) regions of the MOS transistor. The diffusing step is conducted by the heat treatment apparatus having an oil-free vacuum pump. (k) FIG. 10(k) shows a state in which silicon oxide film 107 and phosphor silicate glass (PSF) film 108 are formed as surface protecting films 109. These surface protection films are formed by a CVD apparatus having an oil-free vacuum pump and at an extremely high film quality.

Figure 10L:
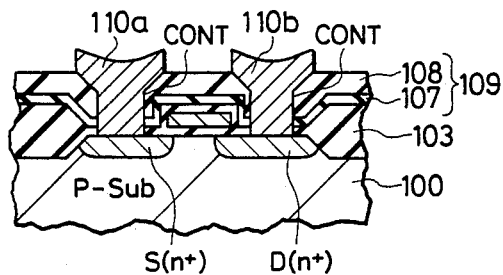

(l) FIG. 10(l) shows a state in which electrodes 110a and 110b, for example, made of aluminum (Al) or the like for electrically connecting source(S)-drain(A) regions after perforating contact holes (cont) for exposing the source(S)-drain(D) regions are formed to the surface protecting films 109. The contact holes (cont) are formed by dry etching technic of disposing a resist to the etching-resistant mask and the dry etching apparatus therefor has anoil-free vacuum pump. Accordingly, the etching chamber is extremely clean and the surface of the source(S)-drain(D) regions is not contaminated by the etching. Further, since the electrodes 110a and 110b are also formed by using a sputtering apparatus or etching apparatus having an oil-free vacuum pump, eletrode materials suffer from no contaminations and show high purity. Accordingly, eletrode having resistance value can be formed.

As has been described above, in the overall production steps for IC as a semiconductor device, if the vacuum condition is prepared in the processing chamber by the control for the number of rotation of the pump as in the previous processing method by using a processing apparatus having an oil-free vacuum pump, the inside of the processing chamber is put at a clean atmosphere with no oil vapor back-diffusion. As a result, the characteristics and the quality of the semiconductor device formed within the processing apparatus can be improved with no contamination troubles.

The following advantageous effects can be obtained based on the foregoing embodiment:

(1) Since the risk of the back diffusion of diffused substances of suction medium to the processing chamber under a high vacuum condition can necessarily be avoided by the use of the oil-free vacuum pump using no diffusing suction medium as oils or mercury at all, secondary troubles derived from the back-diffusion can completely be prevented, and the quality and the reliability of the processing and the products can be improved.

(2) Since the processing chamber can be maintained at a desired vacuum condition even during the supply of the processing gas by adapting such that the number of rotation of the oil-free vacuum pump is put to feed-back control based on the vacuum condition in the processing chamber, an optimal state can be prepared for the processing thereby enabling to improve the quality and the reliability of the processing and the products.

(3) Since the processing chamber can be evacuated over the range from an atmospheric pressure condition to a high vacuum condition in one system of vacuum pump by constituting the oil-free vacuum pump such that the evacuating action for the viscous flow region (hereinafter referred to as usual evacuating operation) and high evacuating operation in the intermediate flow or molecular flow region (hereinafter referred to a high evacuation operation) can be conducted continuously, it is no more necessary for the combined use of an auxiliary pump for conducting usual evacuating operation such as a mechanical bosster pump or rotary pump, or high vacuum pump for conducting high evacuation such as an oil diffusion pump, as well as it is possible to improve the space efficiency and facilitate the multi-stage construction of the processing chamber.

(4) Since either of the usual evacuating operation or high evacuating operation and desired evacuating speed can simply be obtained by the control for the number of rotation by adapting the oil-free vacuum pump such that switching between the usual evacuating operation and high evacuating operation, as well as increase or decrease of the evacuating speed in each of the regions can be controlled by the increase or decrease for the number of rotation, the processing can be conducted properly and the design for the processing sequence or the like can be simplified.

(5) A vacuum pump of a simple structure capable of attaining from the usual evacuating operation to the high evacuating operation in one system and by the control for the number of rotation can be obtained practically by constituting the oil-free vacuum pump such that the centrifugal compression pump stage is disposed on the suction side and the circumferential flow compression pump stage is disposed on the exhaust side respectively, the rotating part of the centrifugal compression pump stage is constituted with an open type vane having a plurality of sweep back blades, while the fixed part thereof is constituted with a fixed disk having a plurality of blades attached so as to be opposed to the rear face of the vane, in which the direction thereof at the radial outer portion is inwarded relative to the rotational direction.

(6) Since the control can control be conducted simply, accurately and efficiently by adapting the oil-free vacuum pump such that it is rotationally driven by the motor and the number of rotation of the motor is controlled by the inverter, the processing can be conducted more properly.

Although this invention has been described specifically referring to the embodiment made by the present inventor, this invention is no way restricted to the foregoing embodiment but various modifications are naturally possible within a range not departing from the gist of the invention.

For instance, the oil-free vacuum pump is not restricted only to the combination of the centrifugal compression pump stage and the circumferential flow compression pump stage, but it may also be constituted by the combination of the centrifugal compression pump with a mechanical booster pump, rotary pump, screw pump or scroll pump, combination of scroll pumps with each other, combination of a scroll pump with a mechanical booster pump and the like. In summary, it is only necessary for the combination of a pump conducting high evacuating operation by the rotation without using oil or like other suction medium and a pump conducting ordinary evacuating operation also by the rotation.

As apparent from the foregoins, since the phenomenon of the back diffusion of oil vapors to the highly evacuated processing chamber can necessarily be avoided upon evacuating by using the oil-free vacuum pump using no diffusing suction medium, the quality and the reliability of the wafer processing under the reduced pressure and the products can be improved, by the method of producing semiconductor devices according to this invention.

EXAMPLE 4

Figure 9:
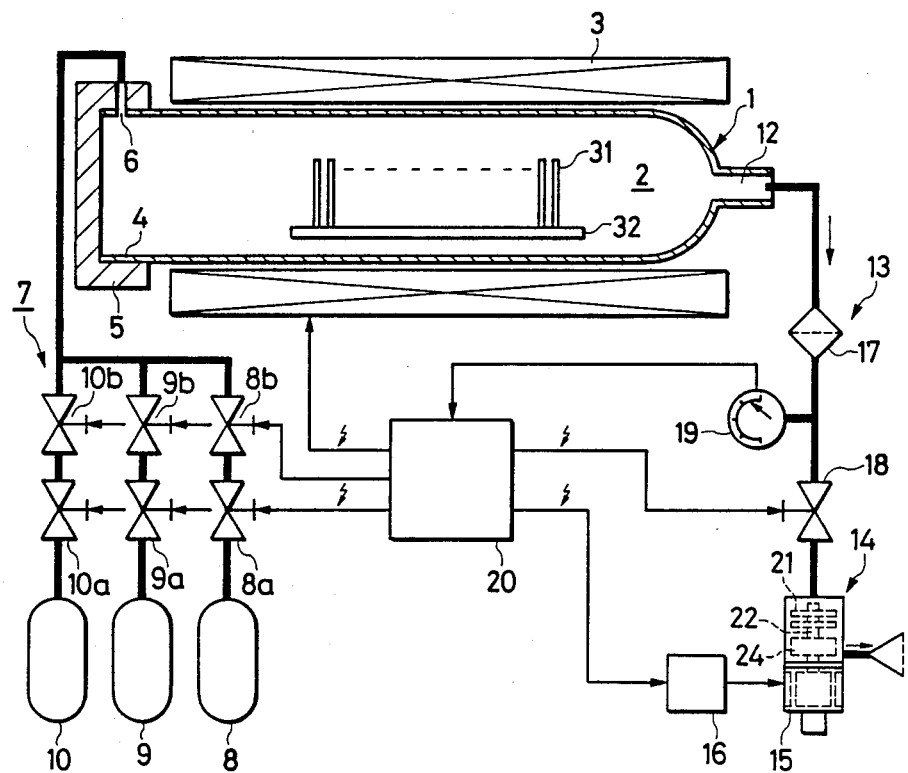
FIG. 9 is a schematic view illustrating a further embodiment according to this invention.
Figure 12:
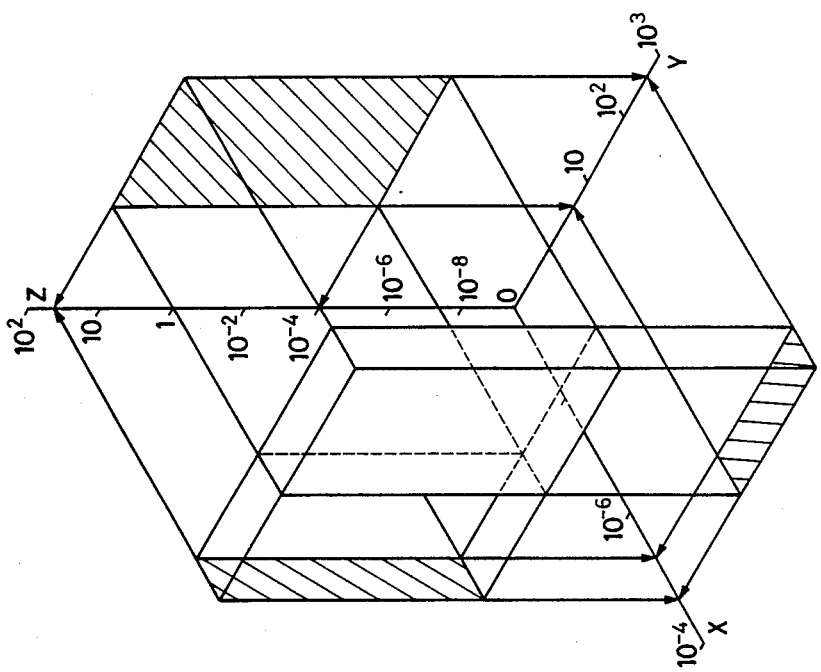
FIGS. 11 and 12 are, respectively, cross sectional views illustrating the production steps for semiconductor devices formed by using the processing apparatus according to this invention.
Figure 11:
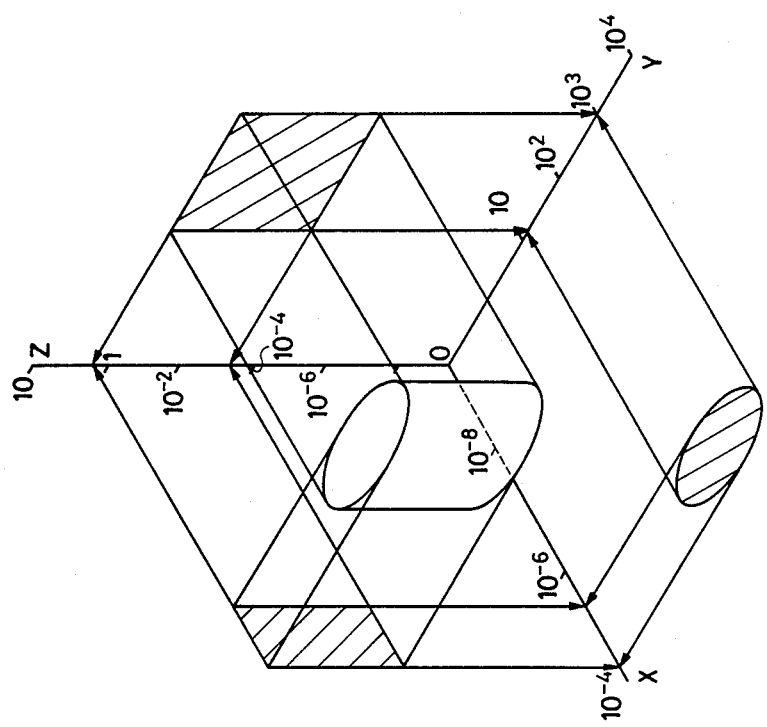

FIG. 9 is a schematic view illustrating a vacuum CVD apparatus using an evacuating apparatus as one embodiment according to this invention, FIG. 2 is a vertical cross sectional view illustrating the entire structure of an oil-free vacuum pump used in the CVD apparatus, FIG. 3(a) is a vertical cross sectional view illustrating the details of a centrifugal compression pump stage in FIG. 2, FIG. 3(b) and 3(c) are, respectively, views taken along lines IIIb and IIIc in FIG. 3(a), FIG. 4(a) is a vertical cross sectional view illustrating the details of a circumferential flow compression pump stage in FIG. 2, FIGS. 4(b) and 4(c) are, respectively, views taken alon lines IVb and IVc in FIG. 4(a), FIGS. 5 is a diagram for explanating the operation of this invention, FIG. 11 is a diagram showing the vacuum condition required by a processing chamber and FIG. 12 is a characteristic diagram for the oil-free vacuum pump.

It has been found a problem that selection of the optimum combination is difficult in preparing a desired vacuum condition by combining a plurality of oil-free vacuum pumps in the conventional evacuating apparatus for the pressure-reduction processing apparatus.

The object of this embodiment is to provide a selection technic capable of selecting the optimal combination of oil-free vacuum pumps.

The outline for the embodiment will be explained as below.

The vacuum condition required for the evacuated chamber is determined regarding the relationship between the evacuating speed and the vacuum degree reached, as well as varying range for the required vacuum degree to prepare three-dimensional diagrams. While on the other hand, characteristics for a plurality of oil-free vacuum pumps are determined regarding the relationship between the evacuating speed and the vacuum degree reached, as well as for the range of the adaptible vacuum degree of the vacuum pump, to prepare three-dimensional diagrams. Each of the diagrams for the respective oil-free vacuum pumps is successively corresponded to the diagrams for the vacuum condition in the evacuated chamber to thereby determine the combination for the oil-free vacuum pumps capable of satisfying the vacuum condition in the evacuated chamber.

According to the means as described above, since each of the diagrams for each of the oil-free vacuum pumps is successively corresponded to the diagrams for the vacuum condition in the evacuated chamber and the combination of the oil-free vacuum pumps capable of satisfying the vacuum condition in the evacutated chamber is determined, oil-free vacuum pumps capable of obtaining the vacuum condition required for each types of the processings can be selected properly and easily, by which the processing chamber requiring clean vacuum condition can be developed rapidly and exactly.

The embodiment of this invention will be described specifically referring to the drawings.

FIG. 7 is a characteristis diagram determined upon selecting the oil-free vacuum pump, in which X-axis represents the vacuum degree reached (Torr), Y-axis represents the evacuating speed (m/h) and Z-axis represents the range for the adaptible vacuum degree. As the method of determining the pump characteristics before the selection, it is desirable to use a method of analysis for simulation by using a computer.

While on the other hand, FIG. 11 is a diagram showing a vacuum condition required for the processing chamber in the vacuum CVD apparatus determined upon selecting oil-free pumps, in which X-axis represents the vacuum degree reached, Y-axis represents the evacuating speed and Z-axis represents the varying range for the required vacuum degree respectively. It is desired to set the vacuum condition somewhat broader also concidering the occurrence of accidental failures or including safety factors.

Upon selecting oil-free vacuum pumps optimal to the vacuum CVD apparatus as one embodiment according to this invention, the pump characteristic diagram shown in FIG. 12 is corresponded to the diagram illustrating the vacuum condition in FIG. 11 and, since the former is contained within the range of the latter, the oil-free vacuum pump as described above has been selected. Both of the diagrams can be corresponded by not only actually overlaying the diagrams with each other by using computer graphics or the likes, as well as by using means of imaginally overlaying data while corresponding them to each other by a computer or the like.

Figure 14:
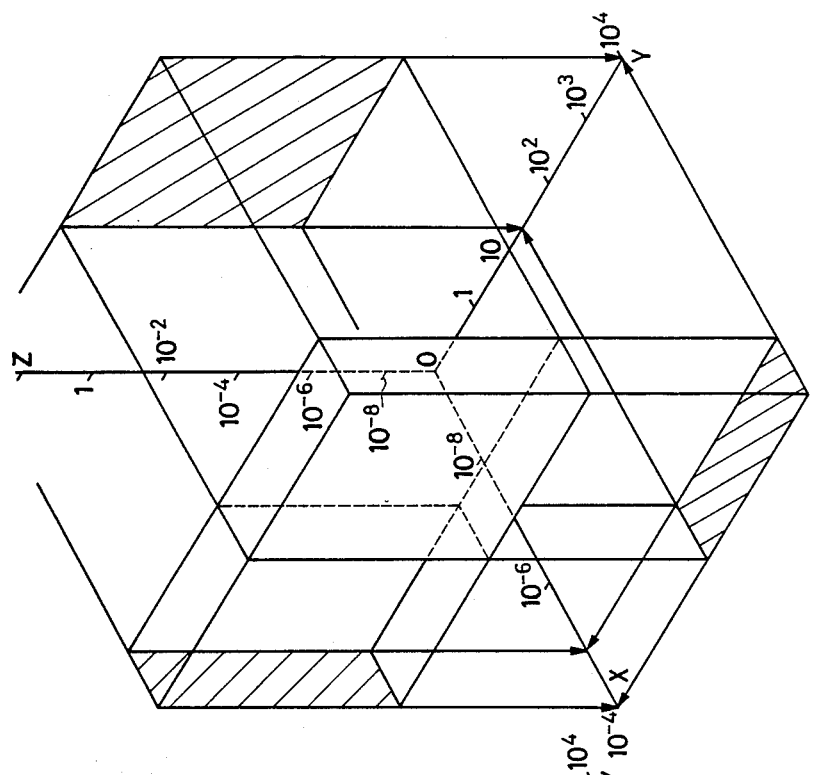
FIG. 14 is a characteristic diagram determined for a two - step type screw vacuum pump.
Figure 13:
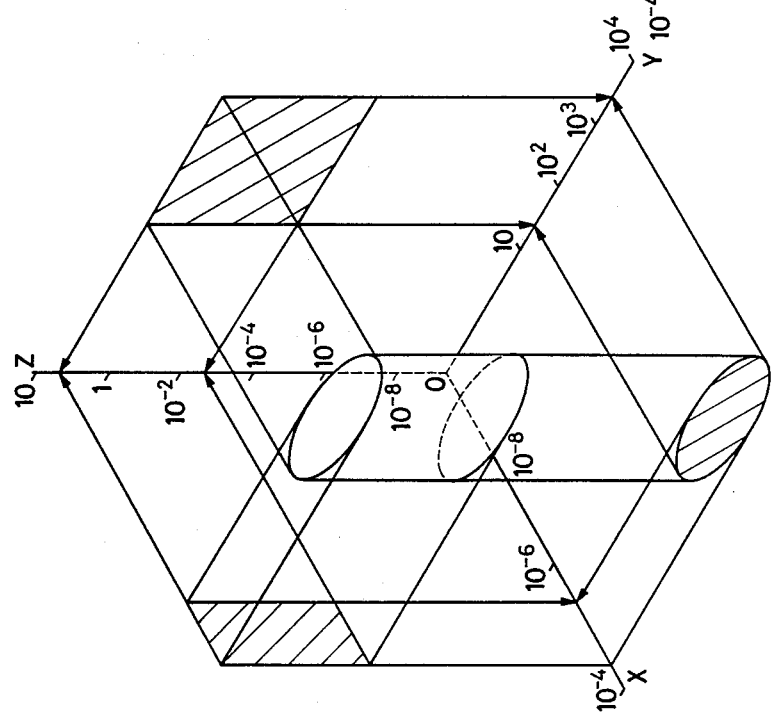
FIG. 13 is a diagram showing an other embodiment according to this invention in which the vacuum state required by a dry-etching processing chamber is shown.
Figure 15:
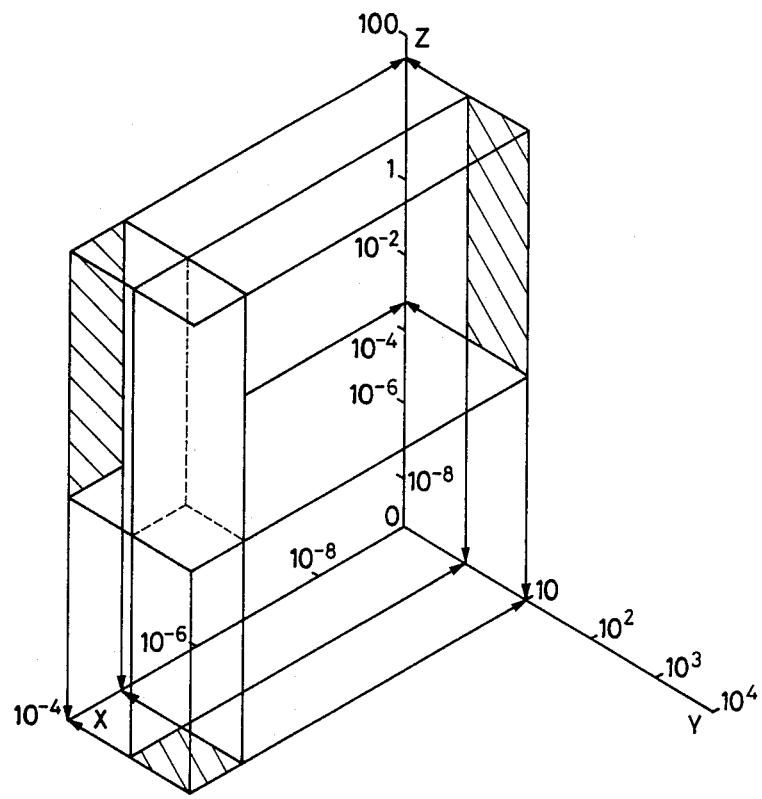
FIG. 15 is a characteristic diagram determined for a scroll vacuum pump.
Figure 16:
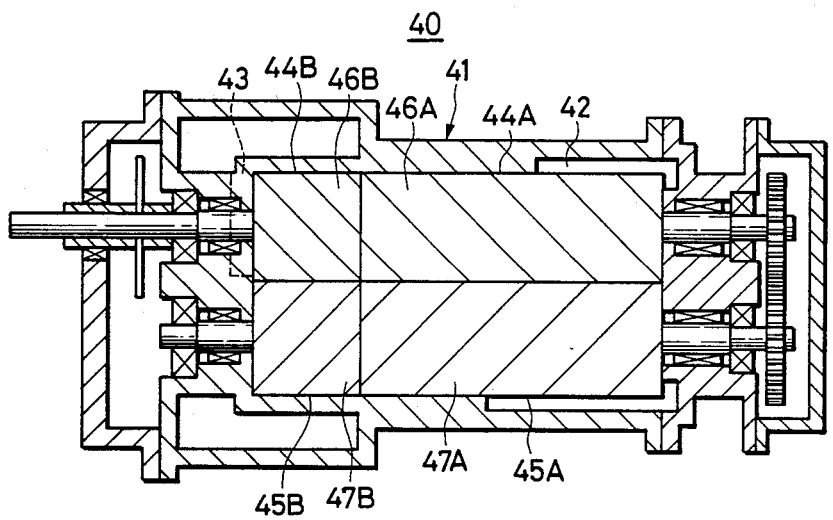
FIG. 16 is a vertical cross sectional view for one embodiment of the screw vacuum pump.
Figure 17:
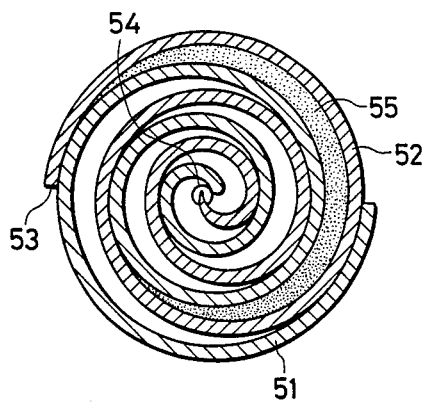
FIG. 17 is a vertical cross sectional view illustrating the principle of the scroll vacuum pump.

FIG. 13 shows another embodiment of this invention in which an optimum combination of oil-free vacuum pumps is selected in the evacuating apparatus of the pressure-reduction processing apparatus and illustrates the vacuum condition required for the dry etching processing chamber, FIG. 14 is a characteristic diagram determined for a 2-step type screw vacuum pump, FIG. 15 is a characteristic diagram determined for a scroll vacuum pump, FIG. 16 is a vertical cross sectional view illustrating one embodiment of the screw vacuum pump and FIG. 17 is a vertical cross sectional view illustrating the principle of the scroll vacuum pump.

The screw vacuum pump illustrated in FIG. 16 is similar to that described in Japanese Patent Application Laying Open No. Sho 60-216089 and the pump 40 has casing 41. Suction port 42 and discharge port 43 are opened on both of right and left ends of the casing 41 and first and second male rotors 44A, 44B, as well as first and second female rotors 45A, 45B are disposed in parallel with each other and rotatably journaled within the casing 41. The male rotor and the female rotor are formed respectively such that a plurality of spiral ridges and grooves are meshed with each other such that a pair of actuation chambers 46A, 46B, 47A and 47B are constituted per one groove. Then, gas is sucked from the suction port 42 to each of the operation chambers constituted with the rotor teeth groove and the casing 41 accompanying with the rotation of the male rotor and then discharged from the discharge port 43.

As shown in FIG. 17, the scroll vacuum pump 50 comprises a pair of spiral scroll members 51, 52 like that of a mosquito killer, in which one scroll member 51 is fixed while the other scroll member 52 is not auto-rotated but revolved around the central portion of the fixed scroll member 51 as a center at a constant radius. Then, an actuation chamber 55 is a cressent type confined with the suction port 53 at the outer circumferential portion gradually displaces to the inner circumferential portion while revolving around the center of the fixed scroll member 51 and then the gas is discharged from the exhaust pot 54 at the central portion.

In this embodiment, upon selecting oil-free vacuum pumps optimum to the dry etching apparatus, the diagram of the screw vacuum pump as described above shown in FIG. 14 is corresponded to the diagram of the vacuum condition shown in FIG. 13. Then, if both of the diagrams are overlapped with each other, the use of the screw vacuum pump is considered.

In case it is not suitable, a turbo type oil-free vacuum pump or the scroll pump is corresponded. If no desired adaptibility can be obtained yet, the diagrams shown in FIG. 12, 14 and 15 for the respective oil-free vacuum pumps are corresponded to the diagram shown in FIG. 13 in a duplicate or triplicate manner and the combined use of plurality kinds of the oil-free vacuum pumps is considered.

Figure 19:
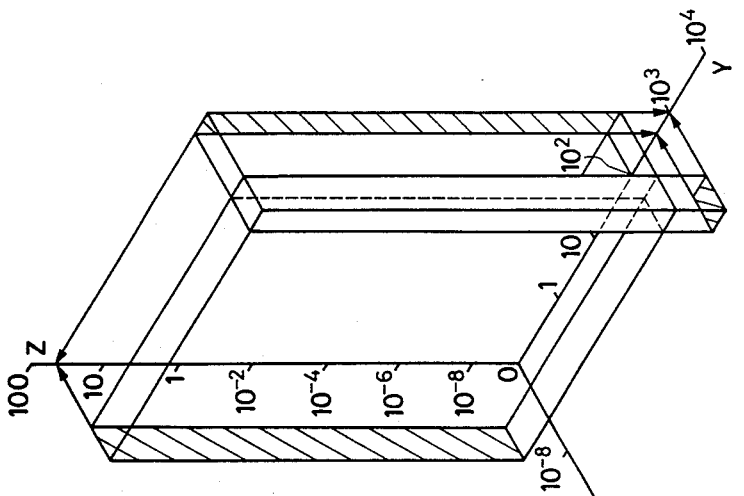
FIG. 19 is a characteristic diagram determined for a pump device comprising a Siegbahn molecular pump and the turbo type vacuum pump in combination.
Figure 18:
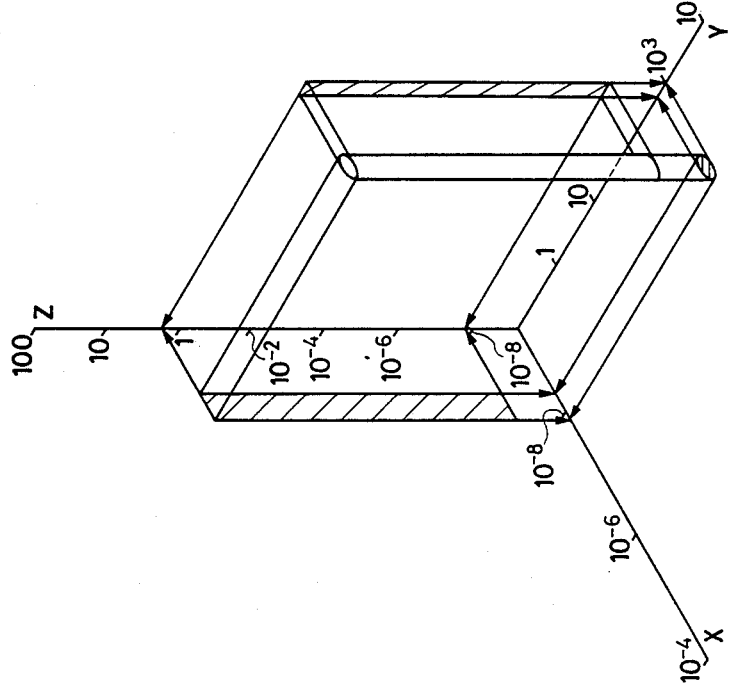
FIG. 18 is a diagram showing a still further embodiment according to this invention in which the vacuum state required by a high vacuum processing chamber is illustrated.

FIG. 18 illustrates a further embodiment of this invention for selecting the combination of optimum oil-free vacuum pumps in the evacuating apparatus for the pressure-reduction processing apparatus and shows a diagram illustrating the vacuum condition required for the highly evacuated processing chamber, and FIG. 19 is a characteristic curve determined for the pump in which a Siegbahn molecular pump and a turbo type vacuum pump are combined.

As the processing chamber requiring high vacuum as in this embodiment, there can be mentioned a sputtering processing chamber, vapor deposition processing chamber, ion spiking processing chamber and the like.

As the oil-free vacuum pump in the case where such high vacuum is required, use of a Siegbahn molecular pump may be considered. However, since the evacuating operation in the viscous flow region can not be obtained by the pump of this type, combined use of an oil-free vacuum pump acting in that region is required. In Example 3, combined use with a turbo type oil-free vacuum pump is employed in view of easy hydrodynamic coupling and mechanical coupling. However, combined use with a screw vacuum pump or scroll vacuum pump is of course possible.

Example 4 can provide the following advantageous effects.

(1) Development for a processing chamber requiring clean vacuum condition can be attained rapidly and exactly since oil-free vacuum pumps capable of obtaining required vacuum condition for various kinds of processings can easily be selected, by determining vacuum condition required for the evacuated chamber regarding the evacuating speed and the vacuum degree reached, as well as varying range for the required vacuum degree, to prepare 3-dimensional diagrams, while determining the characteristics for a plurality of oil-free vacuum pumps regarding the relationship between the evacuating speed and the vacuum degree reached, as well as the range for the adaptible vacuum degree of vacuum pumps, to prepare 3-dimensional diagrams respectively, corresponding each of the diagrams for the respective oil-free vacuum pumps successively to the diagrams for the vacuum condition in the evacuated chamber, to thereby determine the combination of the oil-free vacuum pumps capable of satisfying the vacuum condition in the evacuated chamber.

(2) Since the risk of back-diffusion phenomenon of the suction medium to the processing chamber under high vacuum can essentially be avoided by using oil-free vacuum pumps without using diffusing suction medium such as oil or mercury at all, secondary troubles derived from such a phenomenon can completely be prevented and the quality and the reliability of the processing and the products can be improved.

Although this invention has been described specifically referring to the embodiment made by the present inventor, this invention is no way restricted to the foregoing embodiment but various modifications are naturally possible within a range not departing from the gist of the invention.

For instance, the oil-free vacuum pump is not restricted only to the combination of the centrifugal compression pump stage and the circumferential flow compression pump stage, but it may also be constituted by the combination of the centrifugal compression pump with a mechanical booster pump, rotary pump, screw pump or scroll pump, combination of scroll pumps with each other, combination of a scroll pump with a mechanical booster pump and the like.

The vacuum pump is not retricted only to such a constitution as rotaitonal drive by the motor, or to such a constitution as controlled for the number or rotation by the inverter.

Although the foregoing explanations have mainly been made to such a case of applying the invention made by the present inventor to the art of producing semiconductor devices, which is the background art thereof, this invention is no way restricted only thereto but is also applicable generally to such cases of conducting processing in a processing chambers undergoing high evacuation.

Explanation will then be made simply to the effects obtained by typical embodiments of the invention disclosed in the present application as below.

Development for a processing chamber requiring clean vacuum condition can be attained rapidly and exactly since oil-free vacuum pumps capable of obtaining required vacuum condition for various kinds of processing can easily be selected, by determining vacuum condition required for the evacuated chamber regarding the evacuating speed and the vacuum degree reached, as well as varying range for the required vacuum degree, to prepare 3-dimensional diagrams, while determining the characteristics for a plurality of oil-free vacuum pumps regarding the relationship between the evacuating speed and the vacuum degree reached, as well as the range for the adaptible vacuum degree of vacuum pumps, to prepare 3-dimensional diagrams respectively, coresponding each of the diagrams for the respective oil-free vacuum pumps successively to the diagrams for the vacuum condition in the evacuated chamber, to thereby determine the combination of the oil-free vacuum pumps capable of satisfying the vacuum condition in the evacuated chamber.

What is claimed is:

1. A method of producing semiconductor devices including a step of forming a semiconductor element having a PN-junction on a semiconductor substrate and a step of forming a multi-layered wiring layer comprising an electrical wiring film for said semiconductor element and an insulating film for electrically insulating predetermined portions of said electrical wiring film, wherein the semiconductor substrate is contained in a processing chamber and a polycrystalline silicon film is formed by a CVD process where a considerable amount of hydrogen gas is produced, under a pressure-reduced state in said processing chamber, the inside of said chamber being conditioned over a range from a normal pressure state to a predetermined reduced pressure state, in which the evacuating system of said processing chamber uses a pressure-reducing processing apparatus so adapted that an evacuation pump is constituted only with oil-free vacuum pump and the suction side of said oil-free vacuum pump is connected to a supply source of a gas having molecular weight higher than that of helium (He).

2. A method of producing semiconductor devices as defined in claim 1, wherein argon (Ar) gas is used as a gas having higher molecular weight than that of helium (He).

3. A method of producing semiconductor devices as defined in claim 1, wherein nitrogen (N$_2$) gas is used as a gas having higher molecular weight than that of helium (He).

4. A method of producing semiconductor devices including a step of forming a semiconductor element having a PN-junction on a semiconductor substrate and a step of forming a multi-layered wiring layer comprising an electrical wiring film for said semiconductor element and an insulation film for electrically insulating predetermined portions of said electrical wiring film, wherein the semiconductor substrate is contained in a processing chamber and the multi-layered wiring layer is formed to the surface of the semiconductor substrate under a reduced pressure state in said processing chamber the inside of said chamber being conditioned over a range from a normal pressure to a predetermined reduced pressure state in the step of forming the multi-layered wiring layer, in which the evacuating system of said processing chamber uses an evacuation pump constituted only with oil-free vacuum pump and the suction port side of said oil-free vacuum pump is connected to a supply source of a gas having molecular weight higher than that of helium (He), and wherein the pressure-reducing processing apparatus is a CVD apparatus for forming CVD films under a reduced pressure state through a vapor phase chemical reaction in which a considerable amount of hydrogen gas is produced.

5. A method of producing semiconductor devices as defined in claim 4, wherein argon (Ar) gas is used as a gas having higher molecular weight than that of helium (He).

6. A method of producing semiconductor devices as defined in claim 4, wherein nitrogen (N$_2$) gas is used as a gas having a higher molecular weight than that of helium (He).

7. A method of producing semiconductor devices including a step of forming a semiconductor element having a PN-junction on a semiconductor substrate and a step of forming a multi-layered wiring layer comprising an electrical wiring film for said semiconductor element and an insulation film for electrically insulating predetermined portions of said electrical wiring film, wherein the semiconductor substrate is contained in a processing chamber and wafer treatment is applied to the semiconductor substrate under a reduced pressure state in said processing chamber, the inside of said chamber being conditioned over a range from a normal pressure to a predetermined reduced pressure state in the step of forming the semiconductor element having the PN junction to the semiconductor substrate, in which the evacuating system of said processing chamber uses an evacuation pump constituted only with oil-free vacuum pump and the suction port side of said oil-free vacuum pump is connected to a supply source of a gas having molecular weight higher than that of helium (He), and wherein the pressure-reducing processing apparatus is a vacuum CVD apparatus for forming CVD films under a reduced pressure state through a vapor phase chemical reaction in which a considerable amount of hydrogen gas is produced.

8. A method of producing semiconductor devices as defned in claim 7, wherein argon (Ar) gas is used as a gas having higher molecular weight than that of helium (He).

9. A method of producing semiconductor devices as defined in claim 7, wherein nitrogen (N$_2$) gas is used as a gas having higher molecular weight than that of helium (He).

10. A processing method for conducting processing for wafers under a reduced pressure state in a processing chamber evacuated by an oil-free vacuum pump wherein the oil-free vacuum pump comprises a centrifugal compression pump stage on the side of the suction port and a circumferential flow compression pump stage on the side of the discharge port, respectively, in which the rotational member of said centrifugal compression pump stage is constituted with open type vane having a plurality of sweep back blades, and the fixed member is constituted with a fixed disk having a plurality of blades attached at the radial outer portion thereof so as to be opposed to the rear face of said vane, said blades at the radial outer portion being inwardly directed relative to the rotating direction.

11. A method of producing semiconductor devices including a step of forming a semiconductor element having a PN-junction on a semiconductor substrate and a step of forming a multi-layered wiring layer comprising an electrical wiring film for said semiconductor element and an insulation film for electrically insulating predetermined portion of said electrical wiring film, wherein the semiconductor substrate is contained in a processing chamber and a polycrystalline silicon film is formed by a CVD process under a pressure-reduced state in said processing chamber, the inside of said chamber being conditioned over a range from a normal pressure state to a predetermined reduced pressure state, in which the evacuating system of said procesing chamber uses a pressure-reducing processing apparatus so adapted that an evacuation pump is constituted only with oil-free vacuum pump and the suction side of said oil-free vacuum pump is connected to a supply source of a gas having molecular weight higher than that of helium (He), and wherein the oil-free vacuum pump comprises a housing having a suction port and a discharge port, a rotational shaft rotatably supported within said housing, a plurality of fixed members attached to the inner wall of said housing and a plurality of rotational members attached to said rotational shaft, said fixed members and said rotational members are alternately combined with each other to constitute a pump stage, a centrifugal compression pump stage is constituted to said suction port side, while circumferential flow compression pump stage is constituted to said discharge port side respectively, and the rotation member of said centrifugal compression pump stage comprises an open type vane having a plurality of sweep back blades.

12. A method of producing semiconductor devices as defined in claim 11, wherein argon (Ar) gas is used as a gas having higher molecular weight than that of helium (He).

13. A method of producing semiconductor devices as defined in claim 11, wherein nitrogen (N2) gas is used as a gas having higher molecular weight than that of helium (He).

14. A method of producing semiconductor devices including a step of forming a semiconductor element having a PN-junction on a semiconductor substrate and a step of forming a multi-layered wiring layer comprising an electrical wiring film for said semiconductor element and an insulation film for electrically insulating predetermined portions of said electrical wiring film, wherein the semiconductor substrate is contained in a processing chamber and a polycrystalline silicon film is formed by a CVD process under a pressure-reduced state in said processing chamber, the inside of said chamber being conditioned over a range from a normal pressure state to a predetermined reduced pressure state, in which the evacuating system of said processing chamber uses a pressure-reducing processing apparatus so adapted that an evacuation pump is constituted only with oil-free vacuum pump and the suction side of said oil-free vacuum pump is connected to a supply source of a gas having molecular weight higher than that of helium (He), and wherein a plurality of oil-free vacuum pumps are disposed and at least one of said oil-free vacuum pumps comprises a housing having a suction port and a discharge port, a rotational shaft rotatably supported within said housing, a plurality of fixed members attached to the inner wall of said housing and a plurality of rotational members attached to said rotational shaft, said fixed members and said rotational members are alternately combined with each other to constitute a pump stage, a centrifugal compression pump stage is constituted to said suction port side, while circumferential flow compression pump stage is constituted to said discharge port side respectively, and the rotation member of said centrigual compression pump stage comprises an open type vane having a plurality of sweep back blades.

15. A method of producing semiconductor devices as defined in claim 14, wherein argon (Ar) gas is used as a gas having higher molecular weight than that of helium (He).

16. A method of producing semiconductor devices as defined in claim 15, wherein nitrogen (N2) gas is used as a gas having higher molecular weight than that of helium (He).

* * * * *